US012349320B2

(12) United States Patent
Krietzman

(10) Patent No.: US 12,349,320 B2
(45) Date of Patent: *Jul. 1, 2025

(54) HEADER PANEL ASSEMBLY FOR PREVENTING AIR CIRCULATION ABOVE ELECTRONIC EQUIPMENT ENCLOSURE

(71) Applicant: CHATSWORTH PRODUCTS, INC., Agoura Hills, CA (US)

(72) Inventor: William Drew Krietzman, Rathdrum, ID (US)

(73) Assignee: CHATSWORTH PRODUCTS, INC., Simi Valley, CA (US)

( * ) Notice: Subject to any disclaimer, the term of this patent is extended or adjusted under 35 U.S.C. 154(b) by 815 days.

This patent is subject to a terminal disclaimer.

(21) Appl. No.: 17/516,549

(22) Filed: Nov. 1, 2021

(65) Prior Publication Data

US 2022/0053672 A1 Feb. 17, 2022

Related U.S. Application Data

(63) Continuation of application No. 16/422,295, filed on May 24, 2019, now Pat. No. 11,166,395, which is a
(Continued)

(51) Int. Cl.
*H05K 7/20* (2006.01)
(52) U.S. Cl.
CPC ..... *H05K 7/20836* (2013.01); *H05K 7/20745* (2013.01)
(58) Field of Classification Search
CPC ............ H05K 7/18; H05K 7/14; H05K 7/183; H05K 7/186; H05K 7/1488;
(Continued)

(56) References Cited

U.S. PATENT DOCUMENTS 2,766,861 A 10/1956 Abramson
3,192,306 A 6/1965 Skonnord
(Continued)

FOREIGN PATENT DOCUMENTS

AU 2008254682 11/2012
DE 2509487 A1 9/1976
(Continued)

OTHER PUBLICATIONS

Information Disclosure Statement (IDS) Letter Regarding Common Patent Application(s), dated Nov. 27, 2023.
(Continued)

*Primary Examiner* — Ryan D Kwiecinski
(74) *Attorney, Agent, or Firm* — Tillman Wright, PLLC; James D. Wright; David R. Higgins

(57) ABSTRACT

A hot/cold aisle containment system includes a frame structure, at least one electronic equipment enclosure installed at least partially within the frame structure, and a header panel assembly. The frame structure is adapted to be at least partially covered by one or more panels to define an interior space and includes a vertical member and a horizontal member. The header panel assembly is installed between a top of the at least one electronic equipment enclosure and the horizontal member of the frame structure to prevent circulation of air above the enclosure. The header panel assembly includes a main panel and at least one seal.

18 Claims, 20 Drawing Sheets

Related U.S. Application Data continuation of application No. 15/051,087, filed on Feb. 23, 2016, now Pat. No. 10,306,812, which is a continuation of application No. 13/291,861, filed on Nov. 8, 2011, now Pat. No. 9,313,927.

(60) Provisional application No. 61/411,359, filed on Nov. 8, 2010, provisional application No. 61/411,373, filed on Nov. 8, 2010.

(58) Field of Classification Search
CPC ........... H05K 7/20745; H05K 7/20572; H05K 7/20836; H02B 1/38; E04H 2005/005; G06F 1/181
USPC .............. 52/506.02, 506.03, 506.04, 506.06
See application file for complete search history.

(56) References Cited

U.S. PATENT DOCUMENTS

| | | |
|---|---|---|
| 3,362,403 A | 1/1968 | Fleming et al. |
| 3,364,838 A | 1/1968 | Bradley |
| 3,407,016 A | 10/1968 | Kronenberger |
| 3,493,237 A | 2/1970 | Kleindienst |
| 3,707,060 A | 12/1972 | Jansen, Jr. |
| 3,789,567 A | 2/1974 | Rae et al. |
| 3,830,027 A * | 8/1974 | Paisley .................. E04B 2/825 52/211 |
| 4,007,941 A | 2/1977 | Stancati |
| 4,186,539 A | 2/1980 | Harmon et al. |
| 4,218,079 A | 8/1980 | Arnoldt |
| 4,495,234 A | 1/1985 | Tominaga et al. |
| 4,495,545 A | 1/1985 | Dufresne et al. |
| 4,522,669 A | 6/1985 | Nordin et al. |
| 4,635,422 A | 1/1987 | Nowack et al. |
| 4,782,245 A | 11/1988 | Henry |
| 4,791,980 A | 12/1988 | Hagar et al. |
| 4,852,317 A | 8/1989 | Schiavello et al. |
| 4,859,143 A | 8/1989 | Larrabee et al. |
| 4,895,378 A | 1/1990 | Newquist et al. |
| 4,999,951 A | 3/1991 | Keys et al. |
| 5,020,866 A | 6/1991 | McIlwraith |
| 5,107,622 A | 4/1992 | Fuchs et al. |
| 5,147,121 A | 9/1992 | McIlwraith |
| RE34,393 E | 9/1993 | McIlwraith |
| 5,279,782 A | 1/1994 | Yamamoto et al. |
| 5,361,542 A | 11/1994 | Dettloff |
| 5,488,543 A | 1/1996 | Mazura et al. |
| 5,528,454 A | 6/1996 | Niklos |
| 5,544,012 A | 8/1996 | Koike |
| 5,545,845 A | 8/1996 | Flores |
| 5,570,740 A | 11/1996 | Flores et al. |
| 5,615,122 A * | 3/1997 | Lacrosse ................. B23P 19/00 29/430 |
| 5,695,263 A | 12/1997 | Simon et al. |
| 5,851,143 A | 12/1998 | Hamid |
| 5,927,368 A * | 7/1999 | Rohrer .................. E05D 15/165 160/201 |
| 5,938,302 A | 8/1999 | Anderson et al. |
| 5,954,301 A | 9/1999 | Joseph et al. |
| 5,957,506 A | 9/1999 | Stepp |
| 5,997,117 A | 12/1999 | Krietzman |
| 6,034,873 A | 3/2000 | Stahl et al. |
| 6,044,193 A | 3/2000 | Szetesi et al. |
| 6,104,003 A * | 8/2000 | Jones ..................... H05K 7/207 219/400 |
| 6,127,663 A | 10/2000 | Jones |
| 6,181,557 B1 | 1/2001 | Gatti |
| 6,185,098 B1 | 2/2001 | Benavides |
| 6,198,628 B1 | 3/2001 | Smith |
| 6,222,729 B1 | 4/2001 | Yoshikawa |
| 6,238,029 B1 | 5/2001 | Marzec et al. |
| 6,305,180 B1 * | 10/2001 | Miller ................. H05K 7/20572 165/104.33 |
| 6,336,691 B1 | 1/2002 | Maroney et al. |
| 6,381,147 B1 | 4/2002 | Hayward et al. |
| 6,401,940 B1 | 6/2002 | Hartel et al. |
| 6,410,844 B1 | 6/2002 | Bruner et al. |
| 6,481,172 B1 * | 11/2002 | Porter ....................... B32B 5/18 52/794.1 |
| 6,513,770 B1 | 2/2003 | Franz et al. |
| 6,554,697 B1 | 4/2003 | Koplin |
| 6,601,932 B1 | 8/2003 | Helgenberg et al. |
| 6,611,428 B1 | 8/2003 | Wong |
| 6,616,524 B2 | 9/2003 | Storck, Jr. et al. |
| 6,652,373 B2 | 11/2003 | Sharp et al. |
| 6,672,955 B2 | 1/2004 | Charron |
| 6,695,149 B1 | 2/2004 | Cote et al. |
| 6,788,535 B2 | 9/2004 | Dodgen et al. |
| 6,831,225 B2 | 12/2004 | Chandler |
| 6,859,366 B2 * | 2/2005 | Fink .......................... E04H 5/02 62/414 |
| 6,867,967 B2 | 3/2005 | Mok |
| 6,980,433 B2 | 12/2005 | Fink |
| 7,011,576 B2 | 3/2006 | Sharp et al. |
| 7,033,267 B2 * | 4/2006 | Rasmussen ........ H05K 7/20572 361/691 |
| 7,046,514 B2 | 5/2006 | Fink et al. |
| 7,074,123 B2 | 7/2006 | Bettridge et al. |
| 7,112,131 B2 | 9/2006 | Rasmussen et al. |
| 7,144,320 B2 * | 12/2006 | Turek ................. H05K 7/20736 361/695 |
| 7,145,772 B2 | 12/2006 | Fink |
| 7,173,820 B2 | 2/2007 | Fink et al. |
| 7,226,353 B2 | 6/2007 | Bettridge et al. |
| 7,255,640 B2 | 8/2007 | Aldag et al. |
| 7,259,963 B2 | 8/2007 | Germagian et al. |
| 7,286,345 B2 | 10/2007 | Casebolt |
| 7,293,666 B2 * | 11/2007 | Mattlin .................. H01R 11/01 312/257.1 |
| 7,349,209 B2 | 3/2008 | Campbell et al. |
| 7,425,678 B2 * | 9/2008 | Adducci ................ E05D 15/502 174/53 |
| 7,427,713 B2 * | 9/2008 | Adducci .................. H04Q 1/026 312/265.2 |
| 7,438,638 B2 * | 10/2008 | Lewis, II ............. H05K 9/0041 361/679.48 |
| 7,472,970 B2 | 1/2009 | Bergesch et al. |
| 7,476,804 B2 * | 1/2009 | Adducci .................. H02G 3/32 312/265.2 |
| 7,485,803 B2 | 2/2009 | Adducci et al. |
| 7,486,512 B2 | 2/2009 | Campbell et al. |
| 7,495,169 B2 | 2/2009 | Adducci et al. |
| 7,498,512 B2 | 3/2009 | Adducci et al. |
| 7,500,911 B2 | 3/2009 | Johnson et al. |
| 7,504,581 B2 * | 3/2009 | Adducci .................. H04Q 1/066 174/53 |
| 7,506,768 B2 | 3/2009 | Rassmussen et al. |
| 7,529,086 B2 | 5/2009 | Fink et al. |
| 7,542,287 B2 | 6/2009 | Lewis, II et al. |
| 7,592,541 B2 | 9/2009 | Adducci et al. |
| 7,604,535 B2 | 10/2009 | Germagian et al. |
| 7,608,779 B2 | 10/2009 | Adducci et al. |
| 7,643,291 B2 | 1/2010 | Mallia et al. |
| 7,656,660 B2 * | 2/2010 | Hoeft ................. H05K 7/20745 181/224 |
| 7,667,135 B2 | 2/2010 | Adducci et al. |
| 7,684,193 B2 | 3/2010 | Fink et al. |
| 7,697,285 B2 | 4/2010 | Donowho et al. |
| 7,718,891 B2 * | 5/2010 | Adducci .................. H02B 1/38 312/265.2 |
| 7,746,637 B2 | 6/2010 | Donowho et al. |
| 7,751,188 B1 | 7/2010 | French et al. |
| 7,752,858 B2 | 7/2010 | Johnson et al. |
| 7,764,495 B2 * | 7/2010 | Hruby ................. H05K 7/20572 361/692 |
| 7,772,489 B2 | 8/2010 | Adducci et al. |
| 7,781,675 B2 | 8/2010 | Adducci et al. |
| 7,795,532 B2 | 9/2010 | Walker |
| 7,800,900 B1 * | 9/2010 | Noteboom ......... H05K 7/20745 361/679.48 |
| 7,804,685 B2 * | 9/2010 | Krietzman ................ F24F 7/04 361/679.48 |

(56) References Cited

U.S. PATENT DOCUMENTS

| | | | |
|---|---|---|---|
| 7,839,635 B2 | 11/2010 | Donowho et al. | |
| 7,878,888 B2 | 2/2011 | Rasmussen et al. | |
| 7,880,084 B2 | 2/2011 | Adducci et al. | |
| 7,881,057 B2 | 2/2011 | Fink et al. | |
| 7,894,190 B2 | 2/2011 | Davis et al. | |
| 7,895,855 B2 | 3/2011 | Gooch | |
| 7,944,692 B2 * | 5/2011 | Grantham | H05K 7/20745 361/699 |
| 7,952,869 B2 | 5/2011 | Lewis, II et al. | |
| 7,957,139 B2 | 6/2011 | Davis et al. | |
| 7,974,105 B2 | 7/2011 | Dean, Jr. et al. | |
| 8,004,839 B2 | 8/2011 | Sato et al. | |
| 8,035,965 B2 * | 10/2011 | Adducci | H05K 7/1488 361/692 |
| 8,040,673 B2 | 10/2011 | Krietzman | |
| 8,087,979 B2 | 1/2012 | Rasmussen | |
| 8,107,238 B2 * | 1/2012 | Krietzman | H05K 7/20754 361/679.48 |
| 8,237,052 B2 | 8/2012 | Adducci et al. | |
| 8,248,792 B2 | 8/2012 | Wei | |
| 8,257,155 B2 * | 9/2012 | Lewis, II | H05K 7/20009 454/184 |
| 8,395,046 B2 | 3/2013 | Nicewicz et al. | |
| 8,403,736 B2 | 3/2013 | Rasmussen et al. | |
| 8,405,982 B2 | 3/2013 | Grantham et al. | |
| 8,405,984 B2 | 3/2013 | Donowho et al. | |
| 8,411,465 B2 | 4/2013 | Dean, Jr. et al. | |
| 8,425,287 B2 | 4/2013 | Wexler | |
| 8,437,147 B2 | 5/2013 | Dean, Jr. et al. | |
| 8,459,756 B2 * | 6/2013 | Linhares, Jr. | H05K 7/20736 312/265.3 |
| 8,523,643 B1 * | 9/2013 | Roy | H05K 5/0213 454/184 |
| 8,533,999 B2 | 9/2013 | Otsuka et al. | |
| 8,628,158 B2 | 1/2014 | Caveney | |
| 8,653,363 B2 * | 2/2014 | Behrens | H05K 7/1488 174/547 |
| 8,701,737 B2 * | 4/2014 | Mainers | H05K 7/20745 160/1 |
| 8,730,665 B2 | 5/2014 | Lewis, II et al. | |
| 8,857,120 B2 * | 10/2014 | Marrs | E04B 1/38 52/36.2 |
| 8,867,206 B2 | 10/2014 | Hruby et al. | |
| 9,066,450 B2 * | 6/2015 | Bednarcik | H05K 7/20745 |
| 9,072,200 B2 * | 6/2015 | Dersch | H05K 7/20745 |
| 9,119,329 B2 | 8/2015 | Krietzman et al. | |
| 9,185,824 B2 | 11/2015 | Nordin et al. | |
| 9,313,927 B2 * | 4/2016 | Krietzman | H05K 7/20836 |
| 9,332,863 B2 * | 5/2016 | Ramey | A47F 5/00 |
| 9,380,735 B2 | 6/2016 | Chang | |
| 9,560,777 B2 | 1/2017 | Krietzman et al. | |
| 9,572,286 B2 | 2/2017 | Greeson et al. | |
| 9,585,266 B2 * | 2/2017 | Krietzman | H05K 5/0213 |
| 9,795,060 B2 | 10/2017 | Greeson et al. | |
| 9,888,614 B1 * | 2/2018 | Ross | H05K 7/20736 |
| 9,943,003 B2 | 4/2018 | Segroves et al. | |
| 9,955,616 B2 * | 4/2018 | Krietzman | H05K 13/04 |
| 10,133,320 B2 | 11/2018 | Lewis, II et al. | |
| 10,182,651 B2 * | 1/2019 | Jost | A47B 96/06 |
| 10,306,812 B2 | 5/2019 | Krietzman | |
| 10,334,748 B1 * | 6/2019 | Kostenko | H05K 7/026 |
| 10,334,761 B2 | 6/2019 | Krietzman et al. | |
| 10,375,861 B2 | 8/2019 | Greeson et al. | |
| 10,500,363 B2 | 12/2019 | Raje et al. | |
| 10,568,239 B2 | 2/2020 | Krietzman et al. | |
| 10,568,246 B2 | 2/2020 | Krietzman et al. | |
| 10,595,442 B2 | 3/2020 | Davis | |
| 10,624,232 B2 | 4/2020 | Krietzman | |
| 10,674,634 B2 * | 6/2020 | Lewis, II | H05K 5/0213 |
| 10,765,037 B2 | 9/2020 | Lewis, II et al. | |
| 10,791,640 B2 | 9/2020 | Lewis, II et al. | |
| 10,932,400 B2 | 2/2021 | Krietzman et al. | |
| 11,132,035 B2 | 9/2021 | Lewis, II | |
| 11,166,395 B2 | 11/2021 | Krietzman | |
| 11,212,928 B2 | 12/2021 | Lewis, II et al. | |
| 11,259,446 B2 | 2/2022 | Lewis et al. | |
| 11,444,438 B2 | 9/2022 | Schindler et al. | |
| 11,547,020 B2 | 1/2023 | Lewis, II et al. | |
| 11,622,469 B2 * | 4/2023 | Waz | H05K 7/183 174/50 |
| 11,647,610 B2 | 5/2023 | Greeson et al. | |
| 11,678,447 B2 | 6/2023 | Lewis, II et al. | |
| 11,785,745 B2 | 10/2023 | Lewis, II et al. | |
| 11,880,247 B2 | 1/2024 | Lewis, II et al. | |
| 11,889,633 B2 | 1/2024 | Krietzman et al. | |
| 12,063,758 B2 | 8/2024 | Greeson et al. | |
| 12,082,379 B2 | 9/2024 | Lewis, II et al. | |
| 2002/0027377 A1 | 3/2002 | Nozaki | |
| 2002/0088195 A1 * | 7/2002 | Tan | E04B 9/02 52/302.1 |
| 2002/0153725 A1 | 10/2002 | Myers | |
| 2003/0020379 A1 | 1/2003 | Larsen et al. | |
| 2003/0024196 A1 * | 2/2003 | Huang | E04B 9/32 52/506.06 |
| 2004/0190270 A1 | 9/2004 | Aldag et al. | |
| 2004/0257766 A1 | 12/2004 | Rasmussen et al. | |
| 2005/0095374 A1 | 5/2005 | Cothran et al. | |
| 2005/0168945 A1 | 8/2005 | Coglitore | |
| 2005/0170770 A1 | 8/2005 | Johnson et al. | |
| 2005/0207116 A1 | 9/2005 | Yatskov et al. | |
| 2005/0248043 A1 | 11/2005 | Bettridge et al. | |
| 2005/0259383 A1 | 11/2005 | Ewing | |
| 2006/0082263 A1 | 4/2006 | Rimler et al. | |
| 2006/0102575 A1 * | 5/2006 | Mattlin | H01R 11/01 211/192 |
| 2006/0103270 A1 * | 5/2006 | Bergesch | G06F 1/183 312/223.1 |
| 2006/0139877 A1 * | 6/2006 | Germagian | H05K 7/20745 361/695 |
| 2006/0141921 A1 * | 6/2006 | Turek | H05K 7/20736 454/184 |
| 2006/0260338 A1 | 11/2006 | VanGilder et al. | |
| 2006/0276121 A1 | 12/2006 | Rasmussen | |
| 2006/0283816 A1 | 12/2006 | Moore et al. | |
| 2007/0064389 A1 | 3/2007 | Lewis, II et al. | |
| 2007/0064391 A1 | 3/2007 | Lewis, II et al. | |
| 2007/0113513 A1 * | 5/2007 | Wendt | E04B 9/30 52/506.06 |
| 2007/0129000 A1 | 6/2007 | Rasmussen et al. | |
| 2007/0171610 A1 | 7/2007 | Lewis | |
| 2007/0171613 A1 | 7/2007 | McMahan et al. | |
| 2007/0173189 A1 | 7/2007 | Lewis | |
| 2007/0210679 A1 * | 9/2007 | Adducci | H02G 3/32 312/7.2 |
| 2007/0210680 A1 | 9/2007 | Appino et al. | |
| 2007/0210681 A1 * | 9/2007 | Adducci | H05K 7/183 312/328 |
| 2007/0210683 A1 * | 9/2007 | Adducci | H05K 7/186 312/257.1 |
| 2007/0210686 A1 * | 9/2007 | Adducci | A47B 81/00 312/265.2 |
| 2007/0221393 A1 * | 9/2007 | Adducci | H04Q 1/066 174/50 |
| 2007/0293138 A1 | 12/2007 | Adducci et al. | |
| 2008/0002358 A1 | 1/2008 | Casebolt | |
| 2008/0035810 A1 | 2/2008 | Lewis, II | |
| 2008/0036339 A1 * | 2/2008 | Adducci | H02B 1/202 312/223.2 |
| 2008/0036340 A1 * | 2/2008 | Adducci | H02B 1/202 312/223.2 |
| 2008/0037228 A1 | 2/2008 | Lewis, II | |
| 2008/0062654 A1 | 3/2008 | Mattlin et al. | |
| 2008/0067903 A1 * | 3/2008 | Adducci | E05D 7/1011 312/223.1 |
| 2008/0067904 A1 * | 3/2008 | Adducci | H05K 7/186 312/223.1 |
| 2008/0074012 A1 * | 3/2008 | Adducci | H05K 7/186 312/7.2 |
| 2008/0074849 A1 * | 3/2008 | Adducci | H04Q 1/066 361/724 |

(56) References Cited

U.S. PATENT DOCUMENTS

| | | | |
|---|---|---|---|
| 2008/0079340 A1* | 4/2008 | Adducci | H04Q 1/026 312/286 |
| 2008/0134745 A1 | 6/2008 | Hermanson | |
| 2008/0174217 A1 | 7/2008 | Walker | |
| 2008/0180908 A1* | 7/2008 | Wexler | H05K 7/20745 361/690 |
| 2008/0266789 A1* | 10/2008 | Hruby | H05K 7/20572 361/692 |
| 2008/0316702 A1 | 12/2008 | Donowho et al. | |
| 2008/0316703 A1 | 12/2008 | Donowho et al. | |
| 2009/0059523 A1 | 3/2009 | Mallia et al. | |
| 2009/0086432 A1 | 4/2009 | Campbell et al. | |
| 2009/0129013 A1 | 5/2009 | Donowho et al. | |
| 2009/0134750 A1* | 5/2009 | Adducci | H02G 3/32 312/223.2 |
| 2009/0173017 A1 | 7/2009 | Hall | |
| 2009/0190307 A1 | 7/2009 | Krietzman | |
| 2009/0227197 A1 | 9/2009 | Lewis, II et al. | |
| 2009/0239460 A1 | 9/2009 | Lucia et al. | |
| 2009/0239461 A1 | 9/2009 | Lewis, II et al. | |
| 2009/0241578 A1 | 10/2009 | Carlson et al. | |
| 2009/0273915 A1 | 11/2009 | Dean, Jr. et al. | |
| 2009/0277605 A1 | 11/2009 | VanGilder et al. | |
| 2010/0003911 A1 | 1/2010 | Graczyk et al. | |
| 2010/0027216 A1 | 2/2010 | Matsushima et al. | |
| 2010/0061057 A1 | 3/2010 | Dersch et al. | |
| 2010/0061059 A1 | 3/2010 | Krietzman et al. | |
| 2010/0144265 A1* | 6/2010 | Bednarcik | H05K 7/20745 454/184 |
| 2010/0172092 A1 | 7/2010 | Davis et al. | |
| 2010/0172093 A1 | 7/2010 | Davis et al. | |
| 2010/0178202 A1 | 7/2010 | Isobe et al. | |
| 2010/0188816 A1 | 7/2010 | Bean et al. | |
| 2010/0216388 A1 | 8/2010 | Tresh et al. | |
| 2010/0264788 A1* | 10/2010 | Adducci | H02B 1/202 312/223.2 |
| 2010/0300648 A1* | 12/2010 | Grantham | H05K 7/20745 417/423.15 |
| 2010/0307716 A1* | 12/2010 | Bean, Jr. | H05K 7/20745 165/80.2 |
| 2010/0315775 A1* | 12/2010 | Grantham | H05K 7/20745 361/688 |
| 2011/0011004 A1 | 1/2011 | Courrian et al. | |
| 2011/0019362 A1 | 1/2011 | Krietzman | |
| 2011/0069450 A1* | 3/2011 | Adducci | H04Q 1/064 361/692 |
| 2011/0072729 A1 | 3/2011 | Otsuka et al. | |
| 2011/0084580 A1* | 4/2011 | Adducci | H05K 7/186 248/65 |
| 2011/0111686 A1* | 5/2011 | Hruby | H04Q 1/035 312/223.1 |
| 2011/0148261 A1 | 6/2011 | Donowho et al. | |
| 2011/0205705 A1 | 8/2011 | Graybill et al. | |
| 2011/0211328 A1 | 9/2011 | Dean, Jr. et al. | |
| 2011/0211329 A1 | 9/2011 | Dean, Jr. et al. | |
| 2011/0237174 A1 | 9/2011 | Felisi et al. | |
| 2011/0271610 A1* | 11/2011 | Cottuli | H05K 7/20745 52/173.1 |
| 2011/0278250 A1 | 11/2011 | Malekmadani | |
| 2011/0278998 A1* | 11/2011 | Caveney | H05K 7/20745 312/109 |
| 2011/0278999 A1* | 11/2011 | Caveney | H05K 7/20745 312/198 |
| 2011/0287704 A1 | 11/2011 | Lewis, II et al. | |
| 2011/0290553 A1 | 12/2011 | Behrens et al. | |
| 2012/0013229 A1 | 1/2012 | Krietzman | |
| 2012/0049706 A1 | 3/2012 | Cottuli et al. | |
| 2012/0063087 A1 | 3/2012 | Wei | |
| 2012/0071076 A1 | 3/2012 | Wei et al. | |
| 2012/0080984 A1 | 4/2012 | Watts | |
| 2012/0112612 A1* | 5/2012 | Krietzman | H05K 7/20745 312/236 |
| 2012/0181906 A1* | 7/2012 | Caveney | H05K 7/20745 312/237 |
| 2012/0267991 A1 | 10/2012 | Adducci et al. | |
| 2012/0292278 A1 | 11/2012 | Schluter et al. | |
| 2012/0300391 A1* | 11/2012 | Keisling | H05K 7/20736 211/26 |
| 2013/0029579 A1 | 1/2013 | Lewis, II | |
| 2013/0160271 A1* | 6/2013 | Krietzman | H05K 13/04 29/428 |
| 2013/0163185 A1 | 6/2013 | Gilges et al. | |
| 2013/0165035 A1* | 6/2013 | Krietzman | H05K 7/20745 454/184 |
| 2013/0210335 A1 | 8/2013 | Krietzman et al. | |
| 2013/0276389 A1* | 10/2013 | Marrs | H05K 7/20745 52/173.1 |
| 2013/0293076 A1 | 11/2013 | Karandikar | H02B 1/28 29/428 |
| 2013/0300266 A1* | 11/2013 | Ramey | H05K 7/20745 312/236 |
| 2014/0059941 A1 | 3/2014 | Brookman | |
| 2014/0196394 A1 | 7/2014 | Greeson et al. | |
| 2014/0233205 A1* | 8/2014 | Gardes | F16M 13/022 248/231.91 |
| 2014/0311040 A1 | 10/2014 | One | |
| 2015/0023619 A1 | 1/2015 | Yin et al. | |
| 2015/0065028 A1* | 3/2015 | Krietzman | H05K 7/20009 454/339 |
| 2015/0208554 A1 | 7/2015 | Leigh et al. | |
| 2015/0342094 A1* | 11/2015 | Ross | H05K 7/20145 361/679.46 |
| 2016/0088773 A1 | 3/2016 | Greeson et al. | |
| 2016/0145927 A1 | 5/2016 | Hirakawa et al. | |
| 2016/0194863 A1* | 7/2016 | Schmitt | E04B 1/34321 52/745.02 |
| 2016/0194893 A1* | 7/2016 | Schmitt | G06F 1/189 52/173.1 |
| 2016/0249488 A1* | 8/2016 | Krietzman | H05K 7/20836 |
| 2016/0270270 A1* | 9/2016 | Madsen | H05K 9/0047 |
| 2016/0280153 A1 | 9/2016 | Filipczak et al. | |
| 2017/0121966 A1* | 5/2017 | Jiang | E04B 9/0464 |
| 2017/0127569 A1 | 5/2017 | Rimler et al. | |
| 2017/0142851 A1 | 5/2017 | Krietzman et al. | |
| 2017/0150652 A1 | 5/2017 | Greeson et al. | |
| 2017/0215587 A1* | 8/2017 | Jost | A47B 57/34 |
| 2017/0231107 A1* | 8/2017 | Bernard | A47B 81/00 |
| 2017/0355253 A1 | 12/2017 | Ogawa et al. | |
| 2018/0035570 A1 | 2/2018 | Greeson et al. | |
| 2018/0132385 A1* | 5/2018 | Gosselin | H05K 7/20745 |
| 2018/0192548 A1* | 7/2018 | Shrivastava | H05K 7/1488 |
| 2018/0242483 A1* | 8/2018 | Krietzman | H05K 13/04 |
| 2018/0279498 A1* | 9/2018 | Jiang | E05F 15/56 |
| 2018/0338393 A1* | 11/2018 | Curtin | H05K 7/20745 |
| 2018/0370343 A1 | 12/2018 | Hiroe et al. | |
| 2019/0031007 A1 | 1/2019 | Kamiya | |
| 2019/0073004 A1 | 3/2019 | Lewis, II | |
| 2019/0075685 A1 | 3/2019 | Krietzman et al. | |
| 2019/0084209 A1 | 3/2019 | Hiroe et al. | |
| 2019/0150313 A1* | 5/2019 | Ding | H05K 5/03 361/679.02 |
| 2019/0313551 A1 | 10/2019 | Krietzman et al. | |
| 2019/0343023 A1* | 11/2019 | Lewis, II | H05K 7/183 |
| 2019/0350108 A1 | 11/2019 | Davis | |
| 2019/0350110 A1* | 11/2019 | Krietzman | H05K 7/20836 |
| 2019/0359043 A1 | 11/2019 | Gollapalli et al. | |
| 2020/0011098 A1* | 1/2020 | Pruitt | E05C 17/085 |
| 2020/0077533 A1 | 3/2020 | Lu et al. | |
| 2020/0113074 A1 | 4/2020 | Lewis, II et al. | |
| 2020/0187387 A1 | 6/2020 | Lewis, II et al. | |
| 2020/0205317 A1 | 6/2020 | Davis | |
| 2020/0229331 A1* | 7/2020 | Krietzman | H05K 7/20745 |
| 2020/0396636 A1 | 12/2020 | Lewis, II et al. | |
| 2021/0014988 A1 | 1/2021 | Lewis, II et al. | |
| 2021/0101460 A1 | 4/2021 | Zunzer et al. | |
| 2021/0176905 A1* | 6/2021 | Krietzman | H05K 7/20745 |
| 2021/0300164 A1 | 9/2021 | Kumar | |
| 2021/0352820 A1* | 11/2021 | Hinojosa | H05K 7/18 |
| 2022/0035426 A1 | 2/2022 | Lewis, II | |
| 2022/0053672 A1* | 2/2022 | Krietzman | H05K 7/20745 |

(56) References Cited

U.S. PATENT DOCUMENTS

| | | | |
|---|---|---|---|
| 2022/0061188 A1* | 2/2022 | Greeson | B60J 10/80 |
| 2022/0124924 A1 | 4/2022 | Lewis, II et al. | |
| 2022/0167523 A1* | 5/2022 | Dumas | H05K 7/20172 |
| 2022/0183190 A1* | 6/2022 | Lewis, II | H05K 7/1488 |
| 2023/0096171 A1* | 3/2023 | Campos | H02B 13/025 312/326 |
| 2023/0156974 A1 | 5/2023 | Lewis, II et al. | |
| 2023/0247801 A1 | 8/2023 | Greeson et al. | |
| 2024/0014637 A1* | 1/2024 | Hobbs | H02B 1/32 |
| 2024/0032259 A1 | 1/2024 | Lewis, II et al. | |

FOREIGN PATENT DOCUMENTS

| | | | | |
|---|---|---|---|---|
| EP | 2205054 | A1 | 7/2010 | |
| EP | 3334262 | A1 * | 6/2018 | H05K 7/1488 |
| EP | 3379907 | A1 * | 9/2018 | E05D 15/0652 |
| EP | 3405014 | A1 * | 11/2018 | H05K 7/20745 |
| GB | 2304235 | A * | 3/1997 | H02B 1/01 |
| GB | 2354066 | A | 3/2001 | |
| GB | 2366084 | B | 9/2002 | |
| JP | 2021149850 | A * | 9/2021 | E04B 1/34357 |
| TW | 201630514 | A | 8/2016 | |
| WO | 2006055506 | A2 | 5/2006 | |
| WO | 2008022058 | A2 | 2/2008 | |
| WO | 2008022058 | A3 | 11/2008 | |
| WO | 2008144678 | A1 | 11/2008 | |
| WO | 2009089008 | A2 | 7/2009 | |
| WO | 2009103090 | A2 | 8/2009 | |
| WO | 2009103090 | A3 | 10/2009 | |
| WO | 2010028384 | A2 | 3/2010 | |
| WO | 2010028384 | A3 | 5/2010 | |
| WO | 2010117699 | A1 | 10/2010 | |
| WO | 2011088430 | A2 | 7/2011 | |
| WO | 2011088438 | A2 | 7/2011 | |
| WO | WO-2011143431 | A1 * | 11/2011 | H05K 7/20745 |
| WO | WO-2020018612 | A1 * | 1/2020 | G05B 13/041 |

OTHER PUBLICATIONS

Information Disclosure Statement (IDS) Letter Regarding Common Patent Application(s), dated Jan. 20, 2022.

Rasmussen, Neil, "Air Distribution Architecture Options for Mission Critical Facilities", White Paper #55, Revision 1, American Power Conversion (APC), West Kingston, Rhode Island, 2003 (13 pages).

Chatsworth Products, Inc., "Thermal Management Solutions," Signature Solutions Brochure, available at Internet Web Page <www.chatsworth.com/passivecooling>, dated Mar. 2008 (6 pages).

DCR Product Brochure, Configurations Options, accessed at www.datacenterinarow.com on or about Mar. 2011 (4 pages).

DCR Product Brochure, Self-Contained Data Center Configurations, accessed at www.datacenterinarow.com, on or about Mar. 2011 (2 pages).

DCR Product Brochure, Self-Contained Data Center Features, accessed at www.datacenterinarow.com, on or about Mar. 2011 (2 pages).

DCR Product Brochure, Top Ten Features, accessed at www.datacenterinarow.com, on or about Mar. 2011 (9 pages).

DCR Product Brochure, accessed at www.datacenterinarow.com, on or about Mar. 2011 (25 pages).

Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knurr%20DCD/Smart-Cooling-Solutions-Data-Center-EN.pdf> (51 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust Duct (VED) Instructions, dated 2009 (4 pages).

Panduit Corporation, Panduit Net-Access Vertical Exhaust System (VES) Specification Sheet, dated 2011 (4 pages).

Chatsworth Products, Inc. "Cabinet Airflow Baffles—Air Dam Kit for CPI Cabinet Systems," Product Data Sheet, Jun. 2004 (2 pages).

* cited by examiner

HEADER PANEL ASSEMBLY FOR PREVENTING AIR CIRCULATION ABOVE ELECTRONIC EQUIPMENT ENCLOSURE

CROSS-REFERENCE TO RELATED APPLICATION

The present application is a U.S. continuation patent application of, and claims priority under 35 U.S.C. § 120 to, U.S. nonprovisional patent application Ser. No. 16/422,295, filed May 24, 2019 and entitled "HEADER PANEL ASSEMBLY FOR PREVENTING AIR CIRCULATION ABOVE ELECTRONIC EQUIPMENT ENCLOSURE," which '295 application published as U.S. Patent Application Publication No. US 2019/0350110 A1 on Nov. 14, 2019 and issued as U.S. Pat. No. 11,166,395 on Nov. 2, 2021, which '295 application, the application publication thereof, and the patent issuing therefrom are each incorporated by reference herein in their respective entireties, and which '295 application is a U.S. continuation patent application of, and claims priority under 35 U.S.C. § 120 to, U.S. nonprovisional patent application Ser. No. 15/051,087, filed Feb. 23, 2016 and entitled "HEADER PANEL ASSEMBLY FOR PREVENTING AIR CIRCULATION ABOVE ELECTRONIC EQUIPMENT ENCLOSURE," which '087 application published as U.S. Patent Application Publication No. US 2016/0249488 A1 on Aug. 25, 2016 and issued as U.S. Pat. No. 10,306,812 on May 28, 2019, which '087 application, the application publication thereof, and the patent issuing therefrom are each incorporated by reference herein in their respective entireties, and which '087 application is a U.S. continuation patent application of, and claims priority under 35 U.S.C. § 120 to, U.S. nonprovisional patent application Ser. No. 13/291,861, filed Nov. 8, 2011 and entitled "HEADER PANEL ASSEMBLY FOR PREVENTING AIR CIRCULATION ABOVE ELECTRONIC EQUIPMENT ENCLOSURE," which '861 application published as U.S. Patent Application Publication No. US 2012/0112612 A1 on May 10, 2012 and issued as U.S. Pat. No. 9,313,927 on Apr. 12, 2016, which '861 application, the application publication thereof, and the patent issuing therefrom are each incorporated by reference herein in their respective entireties, and which '861 application is a U.S. nonprovisional patent application of, and claims priority under 35 U.S.C. § 119(e) to, U.S. provisional patent application Ser. No. 61/411,359, filed Nov. 8, 2010 and entitled "ADJUSTABLE WALL ASSEMBLY FOR HOT/COLD AISLE CONTAINMENT SYSTEM," which '359 application is incorporated by reference herein in its entirety, and which '861 application is a U.S. nonprovisional patent application of, and claims priority under 35 U.S.C. § 119(e) to, U.S. provisional patent application Ser. No. 61/411,373, filed Nov. 8, 2010 and entitled "HEADER PANEL ASSEMBLY FOR PREVENTING AIR CIRCULATION ABOVE ELECTRONIC EQUIPMENT ENCLOSURE," which '373 application is incorporated by reference herein in its entirety.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to structures and methods of thermal management in a data center, and, in particular, to a header panel assembly for installation above electronic equipment enclosures in a hot aisle containment structure.

Background

Rack-mounted computer and data storage equipment generates heat during normal operation. When equipment is enclosed in racks, cabinets and other electronic equipment enclosures (hereinafter, collectively, referred to as "enclosures"), heat generated by the equipment can concentrate within the enclosure and cause equipment to overheat and shut down. Thus, proper thermal management is a fundamental aspect of the installation and use of such equipment. Moreover, thermal management is particularly important in data centers in which multiple enclosures are installed, each with heat-generating equipment mounted therein.

Many techniques and solutions have been proposed and used with regard to thermal management in such data centers. One such solution involves utilization of a containment structure to receive heated exhaust air from enclosures installed in the data center or computer room. Enclosures are typically arranged in a row facing with their sides abutting one another. Cool air is drawn into the enclosures from outside the containment structure to cool the equipment mounted in each enclosure. Heated exhaust air is then expelled from the enclosures into a common area within the containment structure, which is segregated from the supply of cool air. Heated exhaust air may then be routed from the containment structure and cooled before being re-circulated into the supply of cool air.

A common difficulty encountered in many known containment structures involves co-mingling of the heated exhaust air with the supply of cool air, which negatively impacts efficiency in the system. Co-mingling may occur for a variety of reasons, but often arises in connection with openings or gaps surrounding enclosures that are installed in the structure. If a gap exists after an enclosure is installed in the structure, heated exhaust air has the potential to travel through the gap and back into the supply of cool air, thereby reducing cooling efficiency in the system. For example, the gaps that have long existed between the tops of enclosures and the ceiling or other structure above the enclosures permit recirculation of heated air that has been exhausted from the rear of an enclosure over the enclosure where it mingles with the cooling air being supplied to the front of the enclosure for intake therein.

Additionally, openings or gaps in the containment structure may have the effect of causing equipment located near the gap to run at a higher operating temperature as warmer air that escapes from within the containment structure is drawn back in to cool the equipment. As a result, over time, such equipment may have a decreased operating life relative to other equipment installed therein.

Further issues may arise if enclosures with varying dimensions are installed within the same containment structure. For example, if enclosures with different vertical dimensions happen to be installed adjacent to one another within the same containment structure, differently-sized panels or blanks must be used to seal off any gaps that are formed above the enclosures. If such panels do not provide a good fit to seal the gap, then inefficiency is likely to exist as heated exhaust air escapes from the containment structure and mixes with the supply of cool air.

Accordingly, a need exists for a containment system that avoids the shortcomings of known containment structure solutions. This, and other needs, are addressed by one or more aspects of the present invention.

SUMMARY OF THE PRESENT INVENTION

Broadly defined, the present invention according to a first aspect includes a hot/cold aisle containment system substantially as shown and described.

Broadly defined, the present invention according to a second aspect includes a hot/cold aisle containment system having a header panel assembly installed between a horizontal member thereof and an electronic equipment enclosure, substantially as shown and described.

Broadly defined, the present invention according to a third aspect includes a hot/cold aisle containment system. The containment system includes a frame structure, at least one electronic equipment enclosure installed at an end of the frame structure, and a header panel assembly. The frame structure is adapted to be at least partially covered by one or more panels to define an interior space and includes a vertical member and a horizontal member. The header panel assembly is installed between a top of the at least one electronic equipment enclosure and the horizontal member of the frame structure to prevent circulation of air above the enclosure.

In features of this aspect, the header panel assembly may include a main panel and at least one seal, the at least one seal being disposed along the lower edge of the main panel and adapted to be held in place between the bottom of the main panel and a top surface of the at least one electronic equipment enclosure; the at least one seal may be compressible; the header panel assembly may further include a fixed bracket adapted to be supported by the horizontal member of the frame structure, wherein the main panel is adapted to be adjustably coupled to the fixed bracket; the header panel assembly may further include at least one clamp for retaining a portion of the main panel against a portion of the fixed bracket; a V-shaped flange may be disposed at the lower edge of the main panel, wherein the at least one seal is disposed at least partially in a groove defined by the V-shaped flange; and a V-shaped flange may be disposed at a side edge of the main panel, wherein the at least one seal is disposed at least partially in a groove defined by the V-shaped flange.

In further features of this aspect, the hot/cold aisle containment system may further include a side seal assembly installed between a side of the at least one electronic equipment enclosure and the vertical member of the frame structure to prevent circulation of air around the enclosure; the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, wherein the at least one seal is disposed at least partially in a groove defined by the V-shaped flange; and the side seal assembly may be adapted to extend from the top to the bottom of the frame structure.

Broadly defined, the present invention according to a fourth aspect includes a hot/cold aisle containment system. The containment system includes a frame structure, at least one electronic equipment enclosure installed at an end of the frame structure, and a side seal assembly. The frame structure is adapted to be at least partially covered by one or more panels to define an interior space and includes a vertical member. The side seal assembly is installed between a side of the at least one electronic equipment enclosure and the vertical member of the frame structure to prevent circulation of air around the enclosure.

In features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; and a V-shaped flange may be disposed along an edge of the vertical support bracket, wherein the at least one seal is disposed at least partially in a groove defined by the V-shaped flange.

Broadly defined, the present invention according to a fifth aspect includes a hot/cold aisle containment system. The containment system includes a frame structure, a header panel assembly, a side seal assembly, and at least one electronic equipment enclosure. The frame structure is adapted to be at least partially covered by one or more panels to define an interior space and includes a vertical member and a horizontal member. The header panel assembly depends from the horizontal member of the frame structure, and the side seal assembly depends from the vertical member of the frame structure. The at least one electronic equipment enclosure is installed at least partially within the frame structure such that a top of the enclosure is sealed by the header panel assembly and a side of the enclosure is sealed by the side seal assembly.

In features of this aspect, the header panel assembly may include a main panel and at least one seal, the at least one seal being disposed along the lower edge of the main panel and adapted to be held in place between the bottom of the main panel and a top surface of the at least one electronic equipment enclosure; the at least one seal may be compressible; the header panel assembly may further include a fixed bracket adapted to be supported by the horizontal member of the frame structure, wherein the main panel is adapted to be adjustably coupled to the fixed bracket; the header panel assembly may further include at least one clamp for retaining a portion of the main panel against a portion of the fixed bracket; a V-shaped flange may be disposed at the lower edge of the main panel, wherein the at least one seal is disposed at least partially in a groove defined by the V-shaped flange; and a V-shaped flange may be disposed at a side edge of the main panel, wherein the at least one seal is disposed at least partially in a groove defined by the V-shaped flange.

In further features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, wherein the at least one seal is disposed at least partially in a groove defined by the V-shaped flange; and the side seal assembly may be adapted to extend from the top to the bottom of the frame structure.

Broadly defined, the present invention according to a sixth aspect includes a header panel assembly, for use in connection with a hot/cold aisle containment system, substantially as shown and described.

Broadly defined, the present invention according to a seventh aspect includes a header panel assembly. The header panel assembly includes a fixed bracket, adapted to be supported by a horizontal frame structure of a hot/cold aisle containment system; a main panel, having a lower edge, that is adjustably coupled to the fixed bracket; and a seal, disposed along the lower edge of the main panel, that is adapted to be held in place between the bottom of the main panel and a top surface of at least one electronic equipment enclosure installed beneath the header panel assembly.

In features of this aspect, the seal may be compressible; the header panel assembly may further include at least one clamp for retaining a portion of the main panel against a portion of the fixed bracket; a V-shaped flange may be disposed at the lower edge of the main panel, wherein the seal is disposed at least partially in a groove defined by the V-shaped flange; and the main panel may further include a side edge having an additional V-shaped flange, wherein an additional seal is disposed along the side edge at least partially in a groove defined by the additional V-shaped flange and is adapted to be held in place between the side of the main panel and an adjacent structure.

Broadly defined, the present invention according to an eighth aspect includes a header panel assembly. The header panel assembly includes a fixed bracket, adapted to be supported by a horizontal frame structure of a hot/cold aisle containment system; a main panel, having a side edge, that is adjustably coupled to the fixed bracket; and a seal, disposed along the side edge of the main panel, that is adapted to be held in place between the side of the main panel and an adjacent structure.

In features of this aspect, the seal may be compressible; a V-shaped flange may be disposed at the side edge of the main panel, wherein the seal is disposed at least partially in a groove defined by the V-shaped flange; and the adjacent structure may be a side seal assembly.

Broadly defined, the present invention according to a ninth aspect includes a side seal assembly, for use in connection with a hot/cold aisle containment system, substantially as shown and described.

Broadly defined, the present invention according to a tenth aspect includes a side seal assembly. The side seal assembly includes a vertical support bracket, adapted to be supported by a vertical frame structure of a hot/cold aisle containment system, that includes a V-shaped flange extending vertically along the side thereof; and a seal, disposed within a groove defined by the V-shaped flange, that is adapted to be held in place between the side of the vertical support bracket and an adjacent electronic equipment enclosure.

In features of this aspect, the seal may be compressible; and the vertical support bracket may include one or more horizontal slots to facilitate lateral adjustment thereof.

Broadly defined, the present invention according to an eleventh aspect includes a method of sealing a hot/cold aisle containment system as substantially shown and described.

Broadly defined, the present invention according to a twelfth aspect includes a hot/cold aisle containment system that includes a frame structure and at least one electronic equipment enclosure installed at least partially within the frame structure, and a header panel assembly. The frame structure is adapted to be at least partially covered by one or more panels to define an interior space. The frame structure includes a vertical member and a horizontal member. The header panel assembly is installed between a top of the at least one electronic equipment enclosure and the horizontal member of the frame structure to prevent circulation of air above the enclosure. The header panel assembly includes a main panel and at least one seal.

In features of this aspect, the at least one seal may be disposed along the lower edge of the main panel and adapted to be held in place between the bottom of the main panel and a top surface of the at least one electronic equipment enclosure; the at least one seal may be disposed along a side edge of the main panel and adapted to be held in place between the side of the main panel and an adjacent structure; the header panel assembly may further include a fixed bracket adapted to be supported by the horizontal member of the frame structure, and the main panel may be adapted to be adjustably coupled to the fixed bracket; and the header panel assembly may further include at least one clamp for retaining a portion of the main panel against a portion of the fixed bracket.

In further features of this aspect, a V-shaped flange may be disposed at an edge of the main panel, and the at least one seal may be disposed at least partially in a groove defined by the V-shaped flange; a generally perpendicular flange may be disposed at an edge of the main panel, and the at least one seal may be disposed along an outer edge of the generally perpendicular flange; and an angled flange may be disposed at an edge of the main panel, and the at least one seal may be disposed along an outer edge of the angled flange.

In still further features of this aspect, the at least one seal may be compressible; the at least one seal may be a brush seal; and the at least one seal may be a deflectable blade seal.

In still further features of this aspect, the hot/cold aisle containment system may further include a side seal assembly installed between a side of the at least one electronic equipment enclosure and the vertical member of the frame structure to prevent circulation of air around the enclosure; the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, and the at least one seal may be disposed at least partially in a groove defined by the V-shaped flange; and the side seal assembly may be adapted to extend from the top to the bottom of the frame structure.

In still another feature of this aspect, the main panel may be mounted to the horizontal member and adapted to be adjustable in a vertical direction relative to the horizontal member.

Broadly defined, the present invention according to a thirteenth aspect includes a hot/cold aisle containment system that includes a frame structure, at least one electronic equipment enclosure installed at least partially within the frame structure, and a side seal assembly. The frame structure is adapted to be at least partially covered by one or more panels to define an interior space, and the frame structure includes a vertical member. The side seal assembly is installed between a side of the at least one electronic equipment enclosure and the vertical member of the frame structure to prevent circulation of air around the enclosure.

In features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; and a V-shaped flange may be disposed along an edge of the vertical support bracket, and the at least one seal may be disposed at least partially in a groove defined by the V-shaped flange.

Broadly defined, the present invention according to a fourteenth aspect includes a hot/cold aisle containment system that includes a frame structure, a header panel assembly, a side seal assembly, and at least one electronic equipment enclosure installed at least partially within the frame structure. The frame structure is adapted to be at least partially covered by one or more panels to define an interior space, and the frame structure includes a vertical member and a horizontal member. The header panel assembly depends from the horizontal member of the frame structure, and the header panel assembly includes a main panel and at least one seal. The side seal assembly depends from the vertical member of the frame structure. The at least one electronic equipment enclosure is installed at least partially within the frame structure such that a top of the enclosure is sealed by the header panel assembly and a side of the enclosure is sealed by the side seal assembly.

In features of this aspect, the at least one seal may be disposed along the lower edge of the main panel and adapted to be held in place between the bottom of the main panel and a top surface of the at least one electronic equipment enclosure; the at least one seal may be disposed along a side edge of the main panel and adapted to be held in place between the side of the main panel and an adjacent structure; the header panel assembly may further include a fixed bracket adapted to be supported by the horizontal member of the frame structure, and the main panel may be adapted to be adjustably coupled to the fixed bracket; and the header panel assembly may further include at least one clamp for retaining a portion of the main panel against a portion of the fixed bracket.

In further features of this aspect, a V-shaped flange may be disposed at an edge of the main panel, and the at least one seal may be disposed at least partially in a groove defined by the V-shaped flange; a generally perpendicular flange may be disposed at an edge of the main panel, and the at least one seal may be disposed along an outer edge of the generally perpendicular flange; and an angled flange may be disposed at an edge of the main panel, and the at least one seal may be disposed along an outer edge of the angled flange.

In further features of this aspect, the at least one seal may be compressible; the at least one seal may be a brush seal; and the at least one seal may be a deflectable blade seal.

In further features of this aspect, the side seal assembly may include a vertical support bracket and at least one seal, the vertical support bracket being adapted to support the side seal assembly from the vertical member of the frame structure; the vertical support bracket may include one or more horizontal slots to facilitate lateral adjustment thereof; a V-shaped flange may be disposed along an edge of the vertical support bracket, and the at least one seal may be disposed at least partially in a groove defined by the V-shaped flange; and the side seal assembly may be adapted to extend from the top to the bottom of the frame structure.

In still another feature of this aspect, the main panel may be mounted to the horizontal member and adapted to be adjustable in a vertical direction relative to the horizontal member.

Broadly defined, the present invention according to a fifteenth aspect includes a header panel assembly that includes a fixed bracket, a main panel that is adjustably coupled to the fixed bracket, and at least one seal disposed along an edge of the main panel. The fixed bracket is adapted to be supported by a horizontal frame structure of a hot/cold aisle containment system. The at least one seal is adapted to be held in place between the main panel and an adjacent structure.

In a feature of this aspect, the header panel assembly may further include at least one clamp for retaining a portion of the main panel against a portion of the fixed bracket.

In further features of this aspect, a V-shaped flange may be disposed at an edge of the main panel, and the at least one seal may be disposed at least partially in a groove defined by the V-shaped flange; a generally perpendicular flange may be disposed at an edge of the main panel, and the at least one seal may be disposed along an outer edge of the generally perpendicular flange; and an angled flange may be disposed at an edge of the main panel, and the at least one seal may be disposed along an outer edge of the angled flange.

In still further features of this aspect, the at least one seal may be compressible; the at least one seal may be a brush seal; and the at least one seal may be a deflectable blade seal.

In still further features of this aspect, the at least one seal may be disposed along a lower edge of the main panel; and the at least one seal may be disposed along a side edge of the main panel.

In still further feature of this aspect, the adjacent structure may be an electronic equipment enclosure; and the adjacent structure may be a side seal assembly.

Broadly defined, the present invention according to a sixteenth aspect includes a side seal assembly, that includes a vertical support bracket and a seal. The vertical support bracket is adapted to be supported by a vertical frame structure of a hot/cold aisle containment system and includes a V-shaped flange extending vertically along the side thereof. The seal is disposed within a groove defined by the V-shaped flange and is adapted to be held in place between the side of the vertical support bracket and an adjacent electronic equipment enclosure.

In features of this aspect, the seal may be compressible; the seal may be a brush seal; and the seal may be a deflectable blade seal.

In another feature of this aspect, the vertical support bracket may include one or more horizontal slots to facilitate lateral adjustment thereof.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
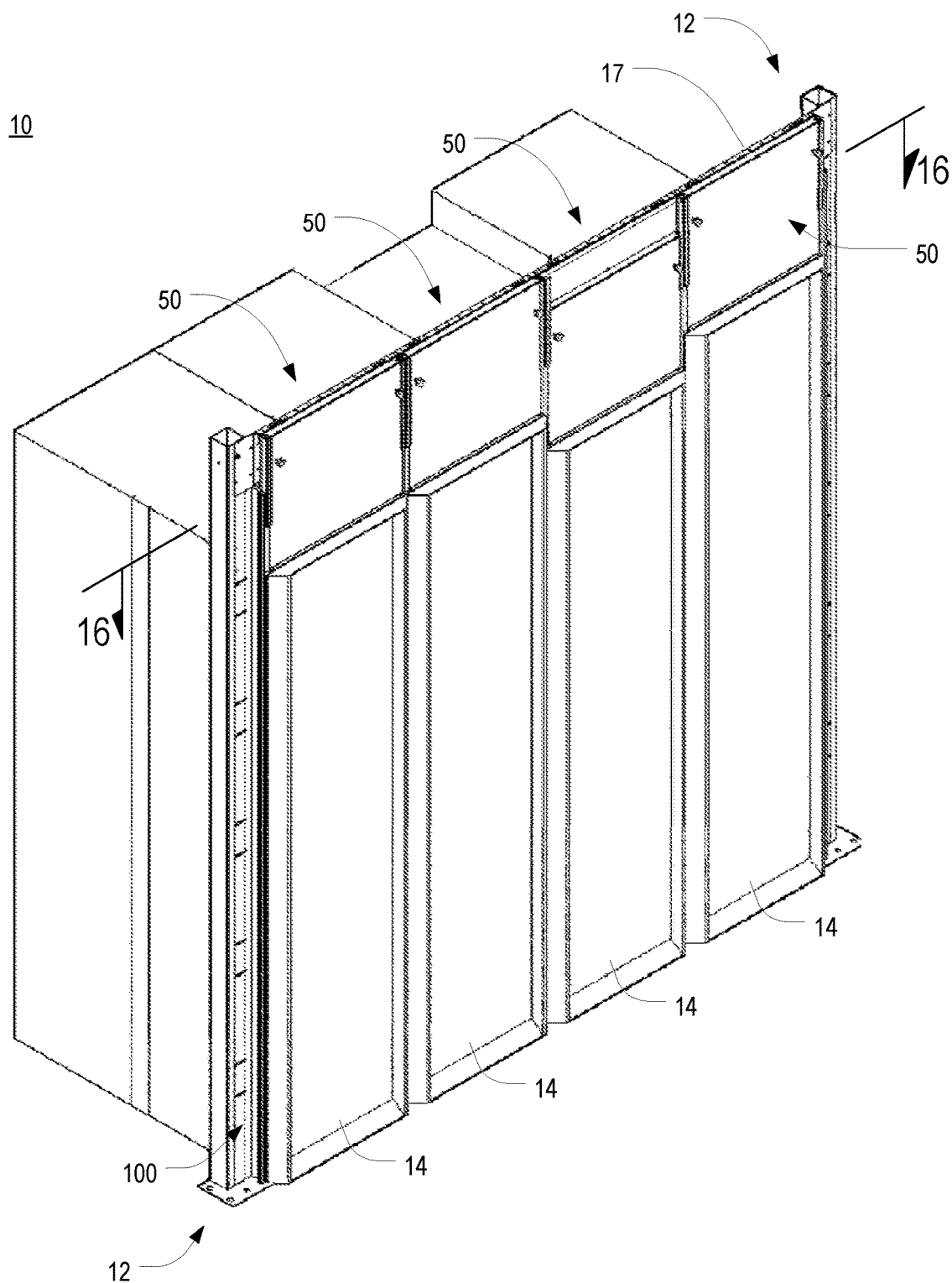
FIG. 1 is an isometric view of a hot/cold aisle containment system in use with a row of electronic equipment enclosures in accordance with a preferred embodiment of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. As should be understood, any embodiment may incorporate only one or a plurality of the above-disclosed aspects of the invention and may further incorporate only one or a plurality of the above-disclosed features. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Regarding applicability of 35 U.S.C. § 112, ¶6, no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

FIG. 1 is an isometric view of a hot/cold aisle containment system 10 in use with a row of electronic equipment enclosures 14 in accordance with a preferred embodiment of the present invention. As shown therein, the containment system 10 includes a frame structure 12, a plurality of header panel assemblies 50 and a pair of side seal assemblies 100. Each of these will be discussed in greater detail hereinbelow. Enclosures suitable for use with preferred embodiments of the present invention are described and illustrated in commonly-assigned U.S. Pat. Nos. 5,997,117; 6,185,098; 7,697,285; 7,804,685; U.S. Patent Application Publication No. US 2009/0227197 A1; and U.S. Patent Application Publication No. US 2010/0172092 A1, the entirety of each of which is incorporated herein by reference.

Figure 2:
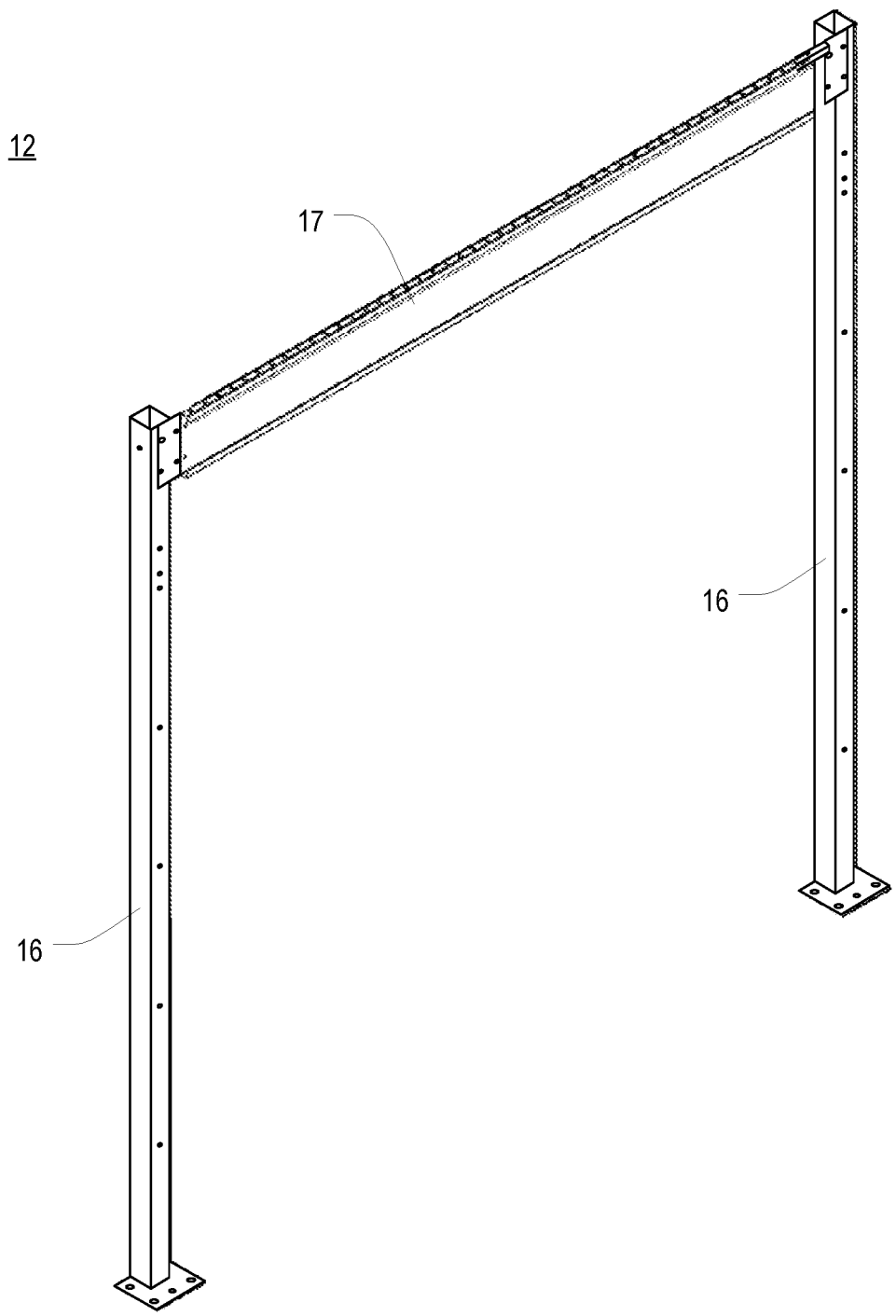
FIG. 2 is an isometric view of the frame structure of FIG. 1.

FIG. 2 is an isometric view of the frame structure 12 of FIG. 1. As shown therein, the frame structure 12 includes a pair of vertical posts 16 and a horizontal beam 17.

Figure 3:
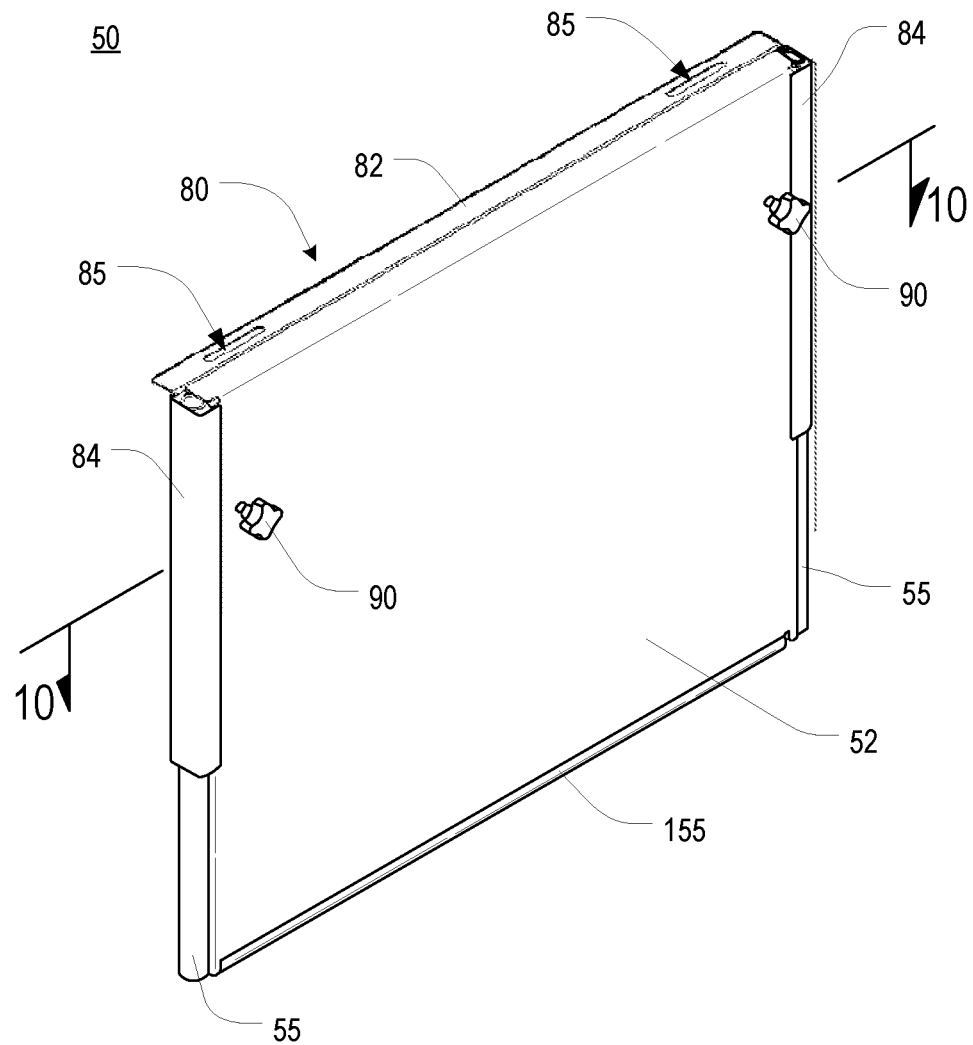
FIG. 3 is an isometric view of one of the header panel assemblies of FIG. 1.
Figure 4:
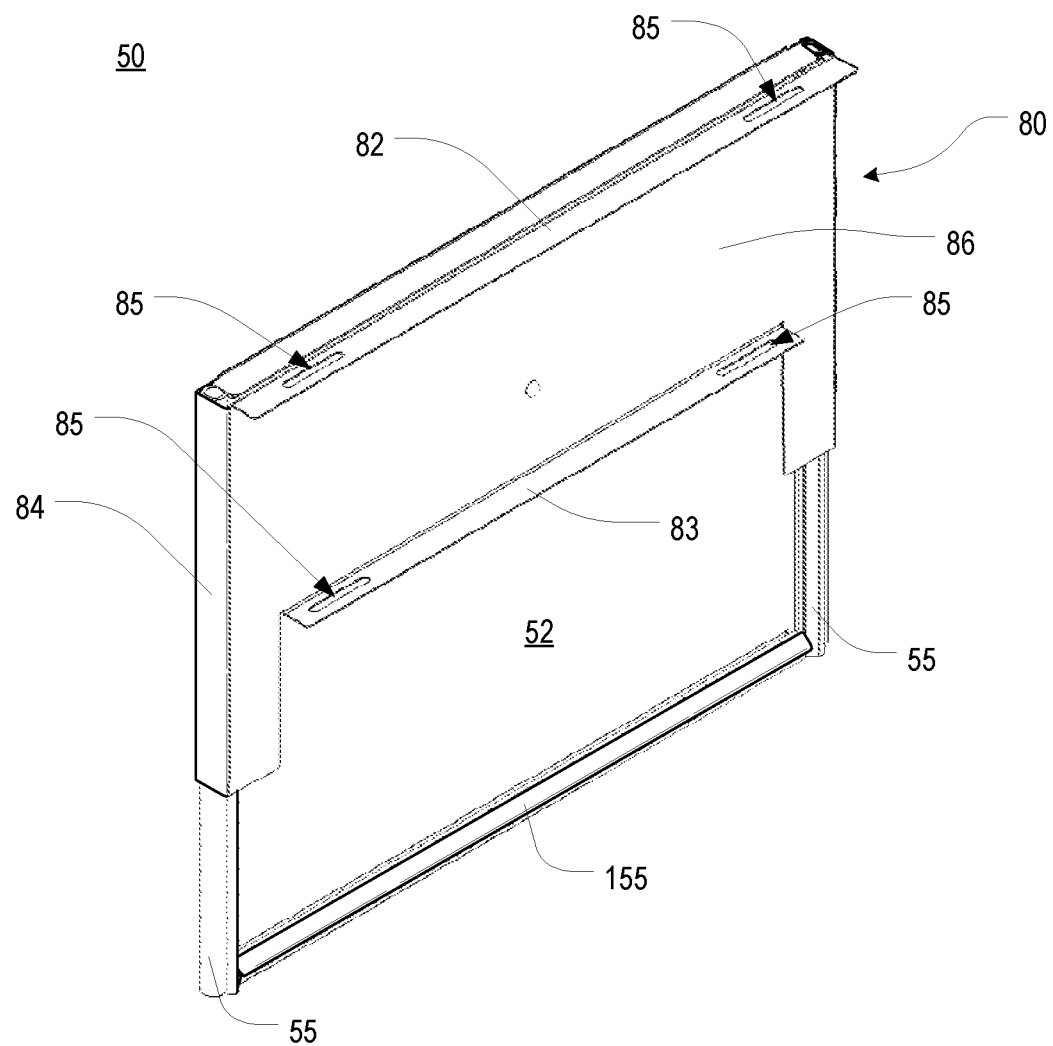
FIG. 4 is a reverse isometric view of the header panel assembly of FIG. 3.
Figure 5:
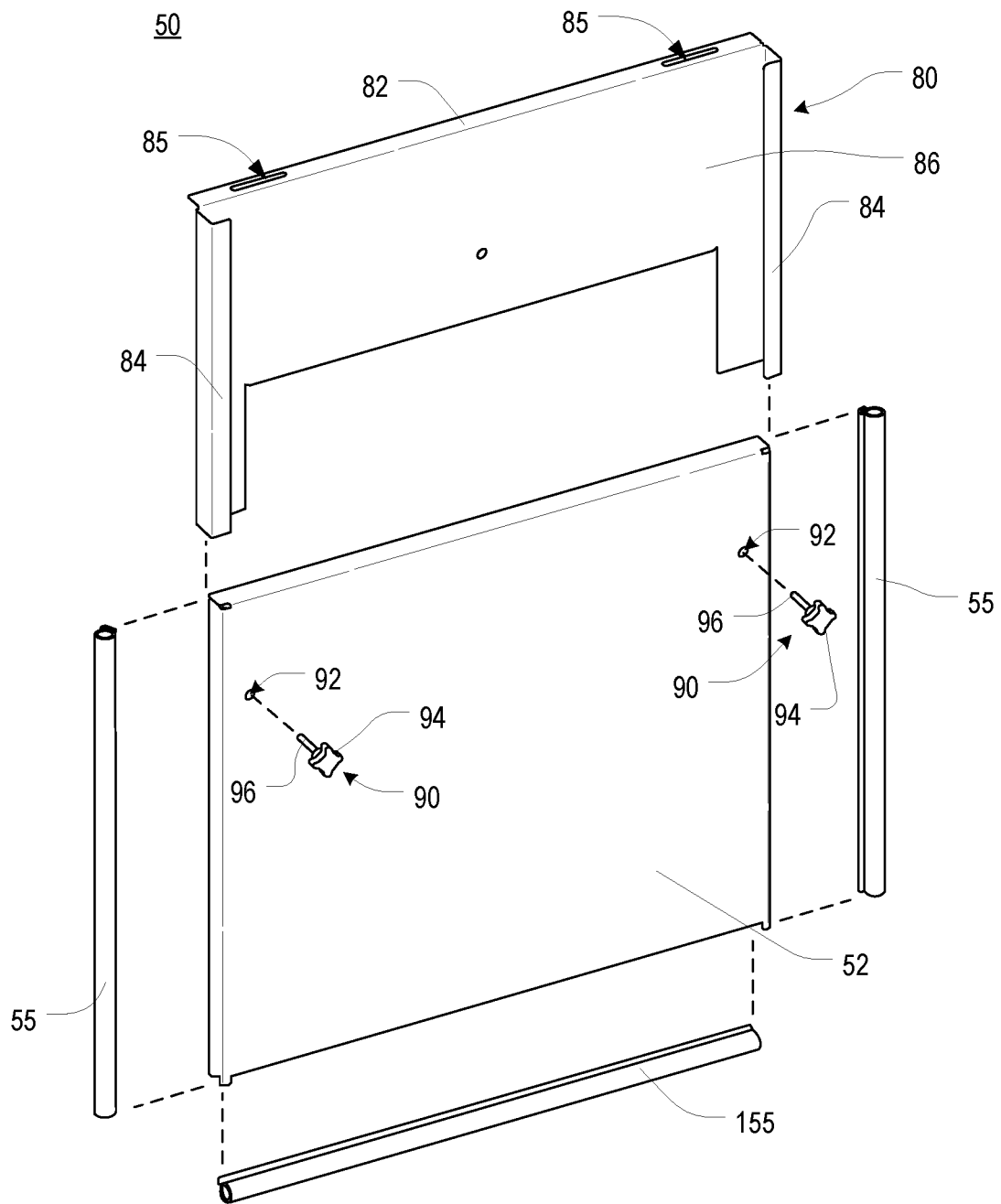
FIG. 5 is an orthogonal exploded view of the header panel assembly of FIG. 3.

FIG. 3 is an isometric view of one of the header panel assemblies 50 of FIG. 1; FIG. 4 is a reverse isometric view of the header panel assembly 50 of FIG. 3; and FIG. 5 is an orthogonal exploded view of the header panel assembly 50 of FIG. 3. As shown therein, each header panel assembly 50 includes a main panel 52, a fixed bracket 80, a pair of clamps 90, and a plurality of seals 55, 155. As perhaps best shown in FIGS. 4 and 5, the fixed bracket 80 includes a top mounting flange 82, a bottom mounting flange 83 and two side retention flanges 84, all extending from a main body 86. The top and bottom mounting flanges 82, 83 facilitate attachment to the horizontal beam 17 of the frame structure 12. Lateral adjustment along the horizontal beam may be facilitated by slots 85 in the mounting flanges 82, 83. The side retention flanges 84 are adapted to receive the main panel 52 as more fully described hereinbelow.

Figure 6:
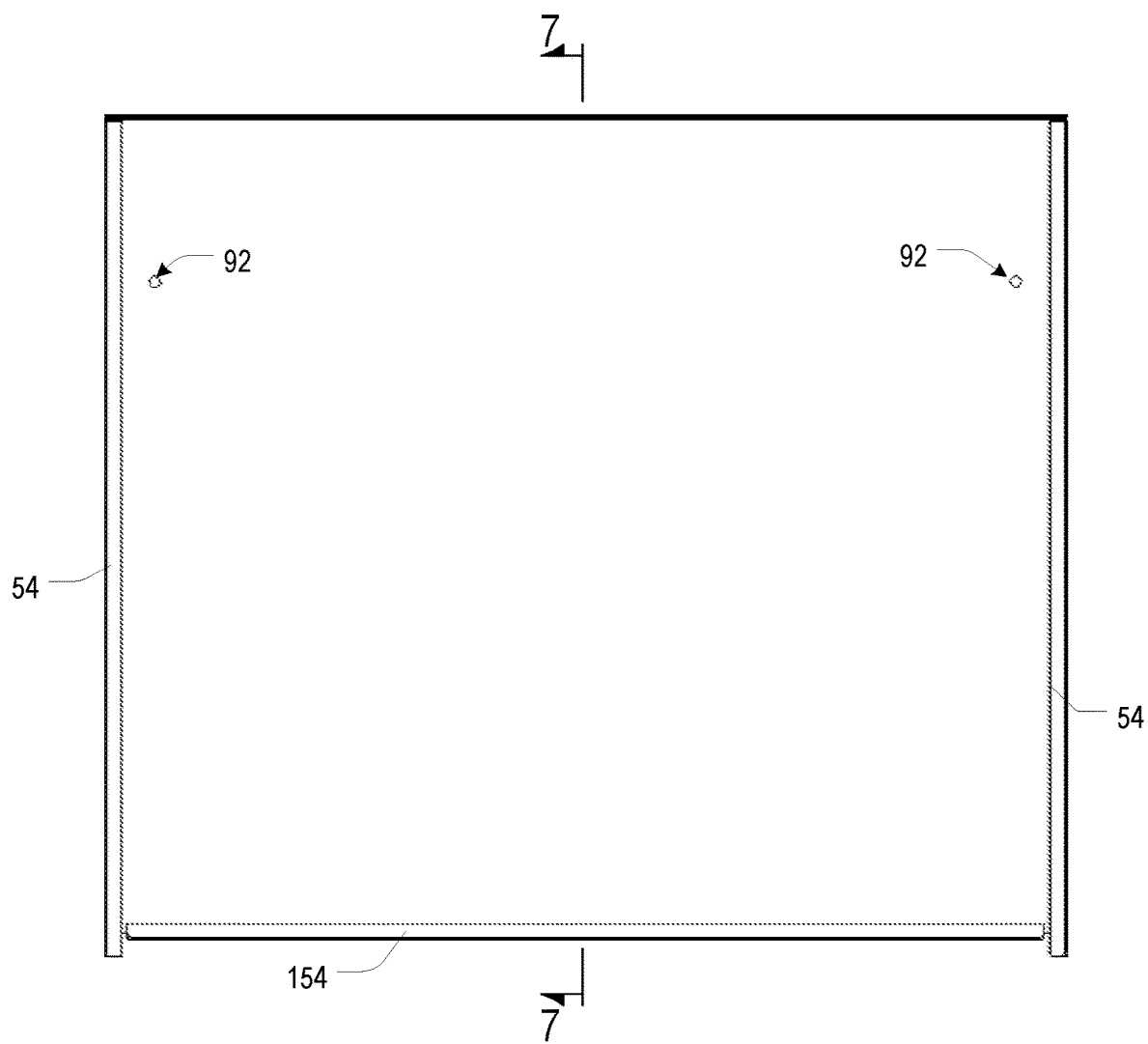
FIG. 6 is a rear plan view of the main header panel of FIG. 3.
Figure 7:
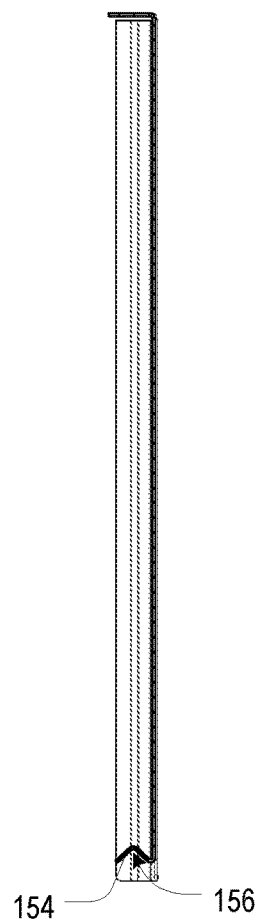
FIG. 7 is an end cross-sectional view of the main panel of FIG. 6, taken along line 7-7.
Figure 8:
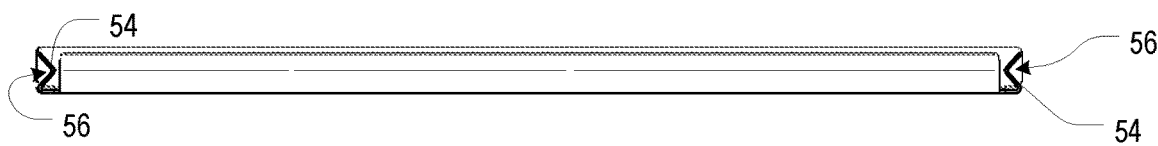
FIG. 8 is a bottom view of the main panel of FIG. 6.
Figure 9:
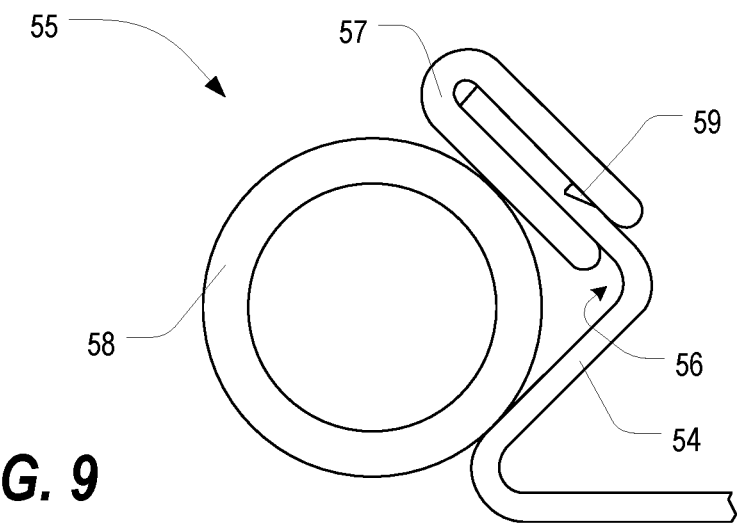
FIG. 9 is a schematic view of a seal mounted in one of the V-shaped grooves of the main header panel of FIG. 6.

FIG. 6 is a rear plan view of the main header panel 52 of FIG. 3, while FIG. 7 is an end cross-sectional view of the main panel 52 of FIG. 6, taken along line 7-7, and FIG. 8 is a bottom view of the main panel 52 of FIG. 6. As shown therein, the main panel 52 includes V-shaped flanges 54, 154 along the sides and bottom thereof. Each V-shaped flange 54, 154 defines a groove 56, 156 of corresponding shape. These grooves 56, 156 are adapted to receive and retain a respective seal 55, 155. In this regard, FIG. 9 is a schematic view of a seal 55 mounted in one of the V-shaped grooves 56 of the main header panel 52 of FIG. 6. It will be appreciated that the seals 55, 155 may have any of a wide range of different shapes and configurations and may be comprised of any of a wide range of different materials. In contemplated embodiments, the seal may be a gasket, a brush, a wiper blade, or a compressible bumper. As seen in cross-section, each seal 55, 155 includes a mounting portion 57 and a body portion 58, wherein the mounting portion 57 is adapted to attach to the edge of the V-shaped flanges 54, 154. Bosses 59 may be provided to assist in such attachment. The body portion 58 is large enough to extend well outside of the V-shaped groove 56, 156 and is comprised of a compressible material of any type conventionally utilized for gaskets, seals, brushes or the like.

Figure 10:
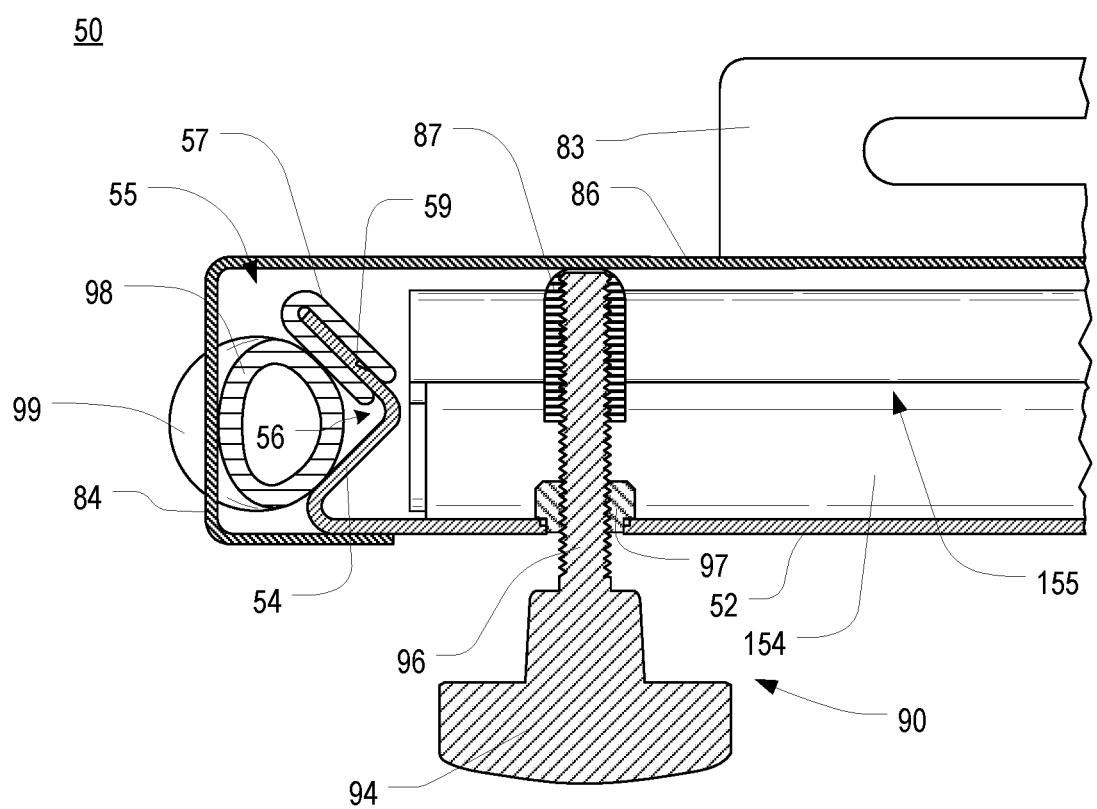
FIG. 10 is a fragmentary top cross-sectional view of the left edge of the header panel assembly of FIG. 3, taken along line 10-10.

When the main panel 52 is positioned within the side retention flanges 84 of the fixed bracket 80, the side seals 55 are partially trapped within the side V-shaped flanges 54 by the retention flanges 84. This is illustrated in FIG. 10, which is a fragmentary top cross-sectional view of the left edge of the header panel assembly 50 of FIG. 3, taken along line 10-10. As shown therein, the upper end 98 of the seal 55 is compressed into the V-shaped groove 56 by the retention flange 84, while the lower end 99 of the seal 55 remains uncompressed. It will be appreciated, however, that when the header panel assembly 50 is properly installed in place next to another header panel assembly 50, a side seal assembly or another structure, the lower end 99 of the seal 55 will usually be compressed as well, thereby sealing the header panel assembly 50 against the respective structure.

Referring again to FIG. 6, it will be appreciated that the lower ends of the side flanges 54 extend below the bottom of the main panel 52, and thus below the bottom flange 154. This arrangement permits the bottom seal 155 to be placed within the bottom groove 156 such that it may be generally aligned with the lower end of the side flanges 54, thereby helping to ensure a complete seal across the bottom of the assembly 50. This is at least partially illustrated in FIG. 3.

With reference to FIGS. 3, 5 and 10, it will be appreciated that the body of the main panel 52 is penetrated by two clamp apertures 92 adapted to receive the clamps 90. In at least some embodiments, the clamps 90 each include a handle 94 and a threaded shaft 96, and a threaded nut 97 is attached behind and around each aperture 92. In other embodiments, the apertures 92 may themselves be threaded, or may comprise sheet metal or the like into which threads may be created by screwing the threaded clamp shaft 96 therethrough. As will be appreciated, the main header panel 52 may be held in place against the fixed bracket 80 by screwing the clamp shafts 96 through the apertures 92 in the panel 52 until the ends of the shafts 96 are forced against the main body 86 of the fixed bracket 80. In order to preserve structural integrity of the main body 86 of the fixed bracket 80, the end of the shafts 96 may be fitted with protective end caps 87. While clamps 90 are shown in the drawings, it is contemplated that a wide range of mechanisms may be used to hold the main panel 52 in place against the fixed bracket 80. In particular, it is contemplated that cam locks, spring fasteners or any of a range of other mechanisms may be implemented to accomplish the clamping function.

Use of the header panel assembly 50 may perhaps be best understood with reference to FIGS. 1 and 10. Each header panel assembly 50 may be installed directly above a respective electronic equipment enclosure 14 to fill the space between the top of the enclosure 14 and the frame structure 12 or other structure above it. The vertical length of each header panel assembly 50 may be adjusted by loosening the clamps 90 and sliding the main header panel 52 up or down relative to the fixed bracket 80 before retightening the clamps 90. The clamp arrangement permits the infinite adjustment of the vertical position of the main header panel 52 relative to its fixed bracket 80 (within a range determined by the dimensions of the panel 52 and bracket 80), and thus allows the header panel assembly 50 to be custom adjusted to fit the space between the top of the respective enclosure 14 and the frame structure 12. When installed above the enclosure 14, the header panel assembly 50 thus blocks the space above the enclosure 14 and prevents recirculation of heated air from the rear of the enclosure 14 over the top thereof where it could mingle with the cooling air being provided to the enclosure front.

The infinite adjustability (within the dimensional range) ensures that air gaps may be substantially entirely eliminated, and differences in enclosure heights managed effectively. This is illustrated, for example, in FIG. 1, where three enclosures 14 have the same approximate height, while a fourth (the second from the right), is shorter than the other three. The header panel assemblies 50 for the first three are all adjusted to be the same length, while the header panel assembly 50 for the fourth enclosure 14 is lengthened to ensure that the bottom of the main panel 52 extends to the top of the enclosure 14 with the bottom seal 155 being compressed between the bottom V-shaped flange 154 and the top of the enclosure 14.

Figure 11:
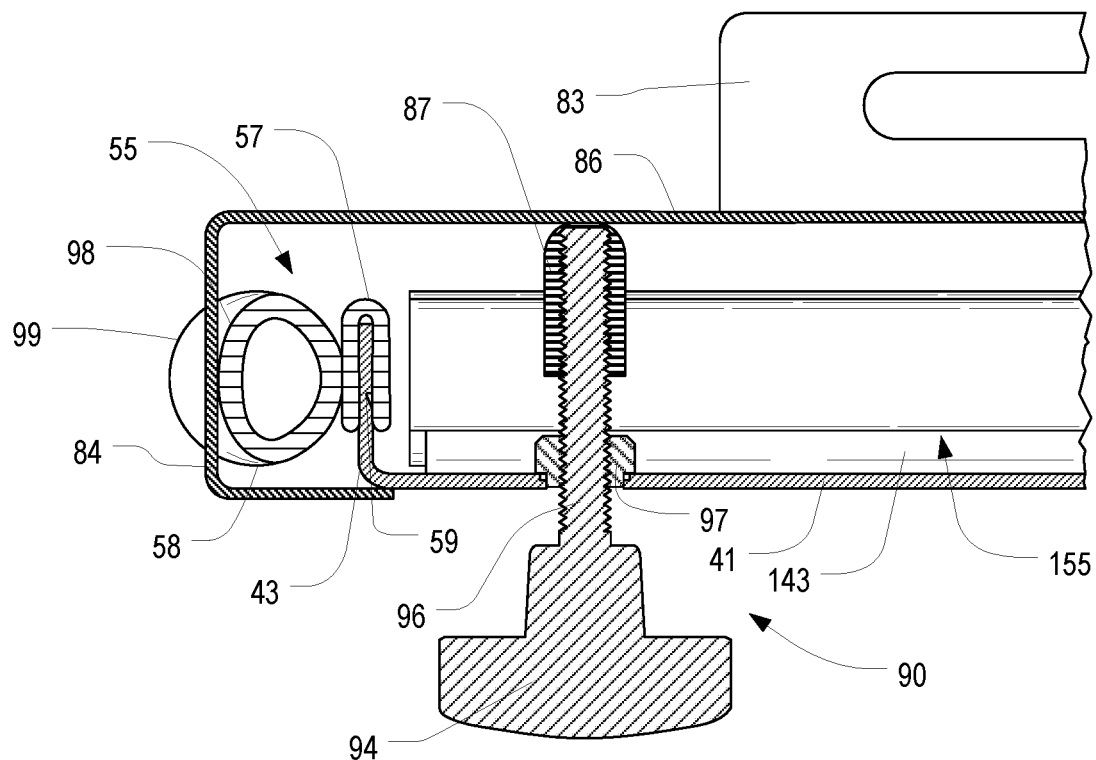
FIGS. 11-13 are fragmentary top cross-sectional views, similar to that of FIG. 10, of the left edge of various alternative header panel assembly embodiments.
Figure 12:
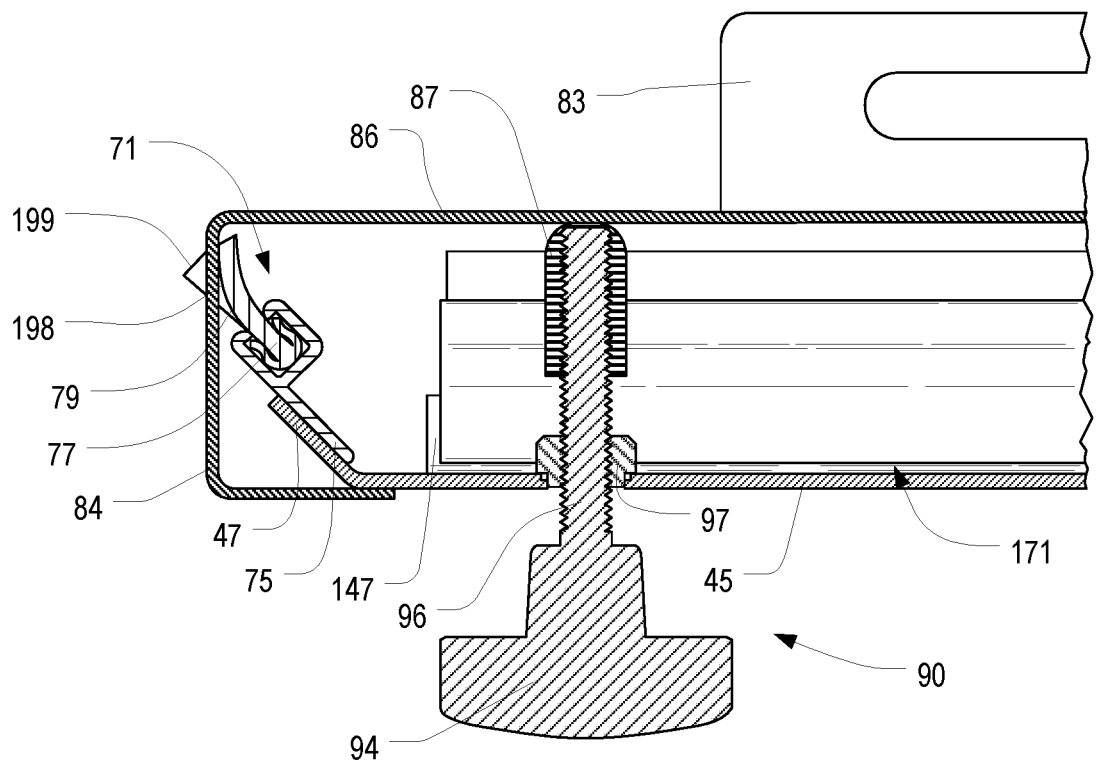
Figure 13:
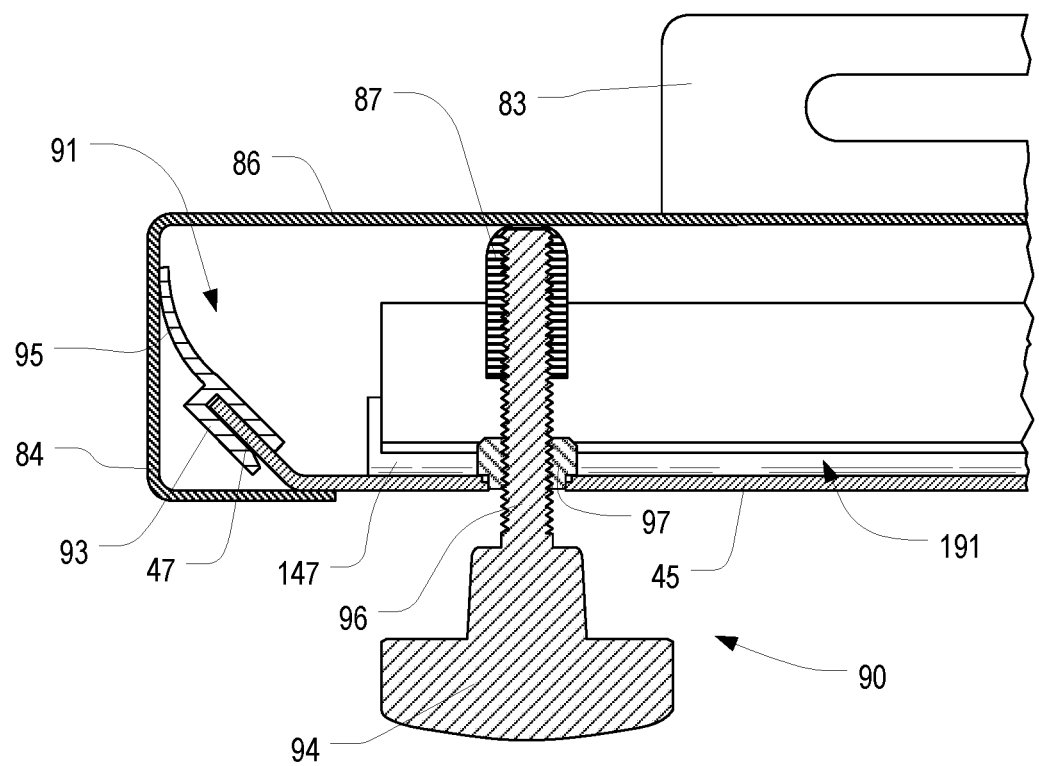

FIGS. 11-13 are fragmentary top cross-sectional views, similar to that of FIG. 10, of the left edge of various alternative embodiments of header panel assemblies. As shown in FIGS. 11-13, flanges on the main panel may have any of a variety of different shapes and configurations. For instance, in FIG. 11, rather than V-shaped flanges, a main panel 41 of a header panel assembly 150 includes generally perpendicular flanges 43, 143 along the sides and bottom thereof. Each perpendicular flange 43, 143 defines an outer edge to accommodate and retain a respective seal 55, 155. As in the embodiment depicted in FIG. 10, each seal 55, 155 includes a mounting portion 57 adapted to attach to the edge of the perpendicular flange 43, 143. Bosses 59 may be provided to assist in such attachment. Each seal 55, 155 further includes a body portion 58 comprised of a compressible material of any type conventionally utilized for gaskets, seals, brushes or the like. When the main panel 41 is positioned within the side retention flanges 84 of the fixed bracket 80, the seals 55, 155 extend from the edges of the main panel 41 and are in a position to abut an adjacent structure, thereby forming a seal therewith. As shown therein, the upper end 98 of the seal 55 is compressed into the V-shaped groove 56 by the retention flange 84, while the lower end 99 of the seal 55 remains uncompressed. It will be appreciated, however, that when the header panel assembly 150 is properly installed in place next to another header panel assembly 150, a side seal assembly or another structure, the lower end 99 of the seal 55 will usually be compressed as well, thereby sealing the header panel assembly 150 against the respective structure.

In FIG. 12, a main panel 45 of a header panel assembly 250 includes flanges 47, 147 at the sides and bottom thereof that extend away from the main panel 45 at an angle. Each angled flange 47, 147 defines an outer edge to which a respective brush seal 71, 171 is attached. Each brush seal 71, 171 includes a cradle portion 75 that attaches along the outer edge of the angled flanges 47, 147 and a brush portion 77 that is adapted to be snap-fit into the cradle portion 75. Bristles 79 of the brush portion 77 extend away from the main panel 45 and are in a position to abut an adjacent structure, thereby forming a seal therewith. As shown in FIG. 12, bristles 79 at the upper end 198 of the brush seal 71 are deflected by the retention flange 84 while bristles 79 at the lower end 199 of the brush seal 71 remain undeflected. It will be appreciated, however, that when the header panel assembly 250 is properly installed in place next to another header panel assembly, a side seal assembly or another structure, the lower end 199 of the brush seal 71 will usually be deflected as well, thereby sealing the header panel assembly 250 against the respective structure.

In FIG. 13, the main panel 45 of a header panel assembly 350 includes flanges 47, 147 at the sides and bottom thereof that extend away from the main panel 45 at an angle. Each angled flange 47, 147 defines an outer edge to which a respective deflectable blade seal 91, 191 is attached. Each blade seal 91, 191 includes an attachment portion 93 that is adapted to fittingly accommodate an outer edge of a corresponding angled flange 47, 147. Each blade seal 91, 191 further includes a blade portion 95 that extends away from the main panel 45 and is in a position to abut an adjacent structure so as to form a seal therewith. As shown in FIG. 13, the blade portion 95 is deflected by, and forms a seal against, the retention flange 84. It will also be appreciated that when the header panel assembly 350 is properly installed in place next to another header panel assembly, a side seal assembly or another structure, any portion of the blade seal 91 that extends below the retention flange 84 would likewise be deflected by an adjacent structure and, thus, capable of sealing the header panel assembly 350 against the respective structure.

Figure 14A:
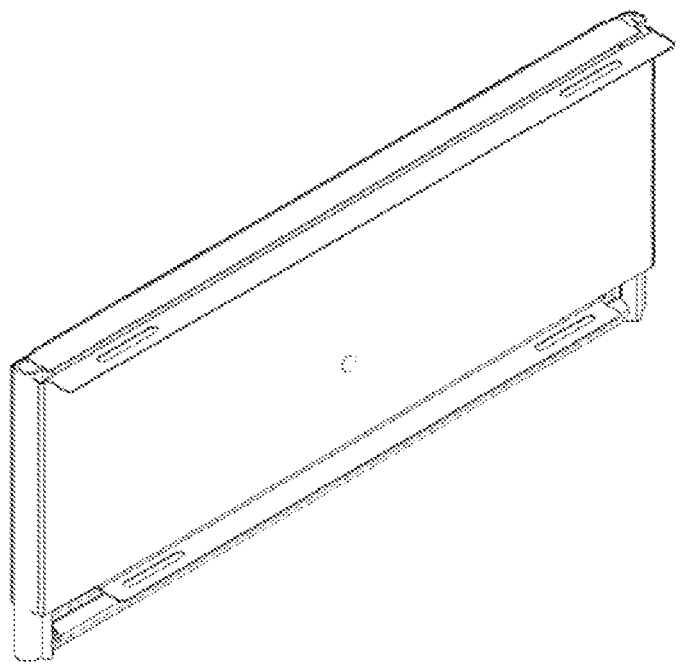
FIGS. 14A-14C are isometric views of header panel assemblies similar to that of FIG. 3 but having different vertical dimensions.
Figure 14B:
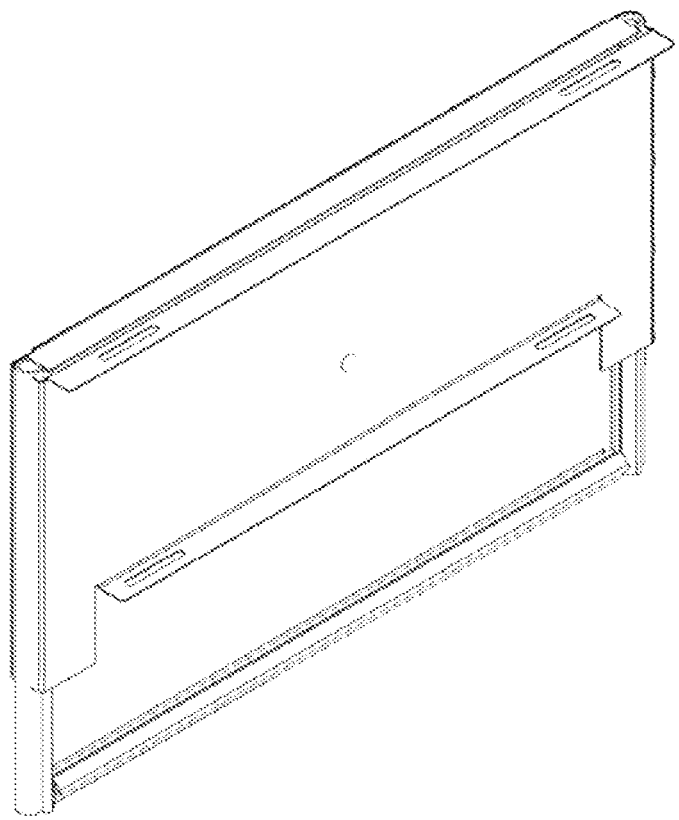
Figure 14C:
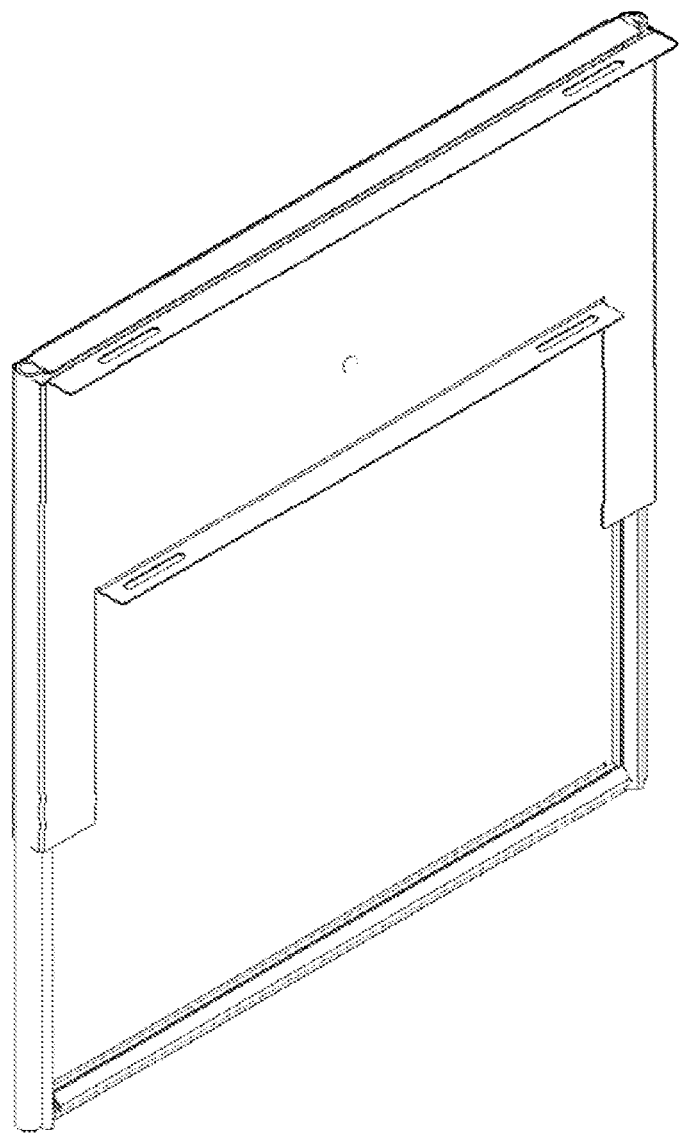

In at least some commercial embodiments, header panel assemblies 50 of different vertical dimensions are provided to accommodate enclosures 14 and frame structures 12 or other structures of different sizes. For example, FIGS. 14A-14C are isometric views of header panel assemblies similar to that of FIG. 3 but having different vertical dimensions. It will also be appreciated that different widths may likewise be provided.

Figure 15:
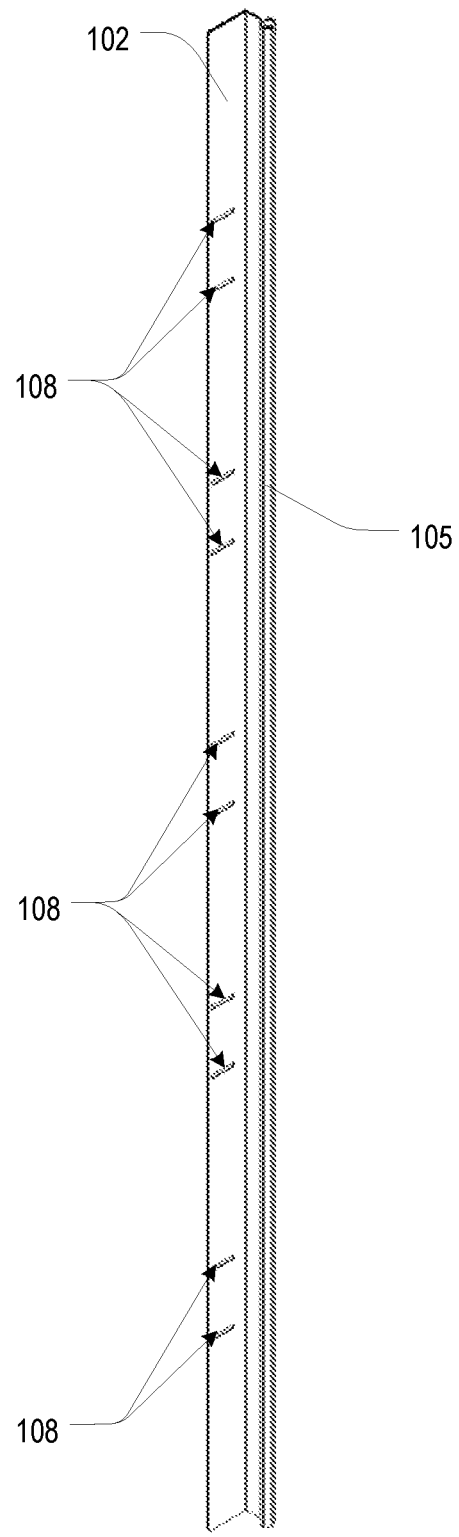
FIG. 15 is an isometric view of one of the side seal assemblies of FIG. 1.

Air sealing along the sides of electronic equipment enclosures 14 at the ends of the row of enclosures 14 may be facilitated by the side seal assemblies 100. FIG. 15 is an isometric view of one of the side seal assemblies 100 of FIG. 1. As shown therein, each side seal assembly 100 includes a vertical support bracket 102 and a seal 105. The vertical support bracket 102 may be attached to a vertical post 16 of the frame structure 12, or other structure, via a plurality of horizontal slots 108. The slots facilitate lateral adjustment along the width of the vertical post 16.

Figure 16:
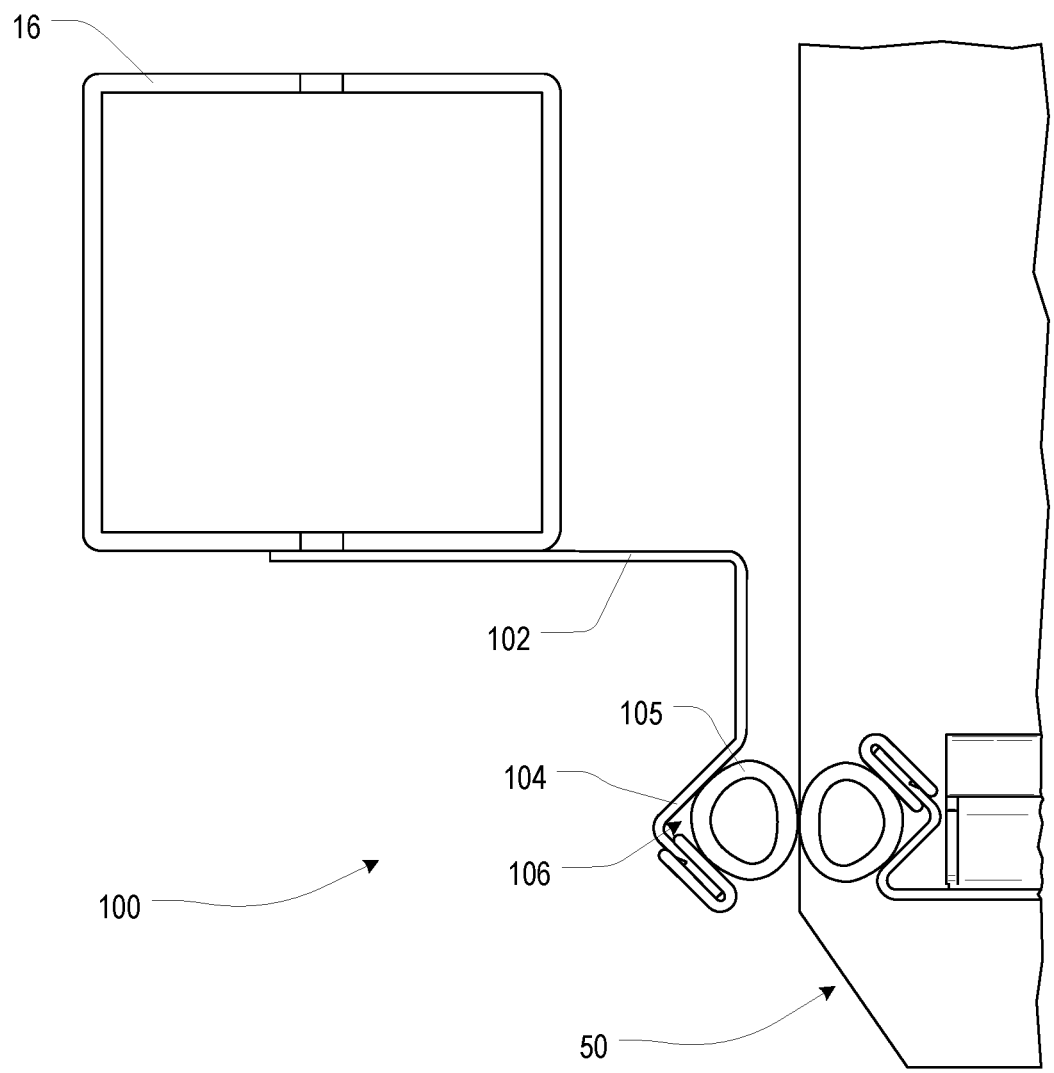
FIG. 16 is a fragmentary top cross-sectional view of the left end of the hot/cold aisle containment system of FIG. 1, taken along line 16-16, illustrating the interface between a header panel assembly and a side seal assembly.

FIG. 16 is a fragmentary top cross-sectional view of the left end of the hot/cold aisle containment system 10 of FIG. 1, taken along line 16-16, illustrating the interface between a header panel assembly 50 and a side seal assembly 100. As shown therein, the vertical support bracket 102 includes a V-shaped flange 104, similar in cross-section to the V-shaped flanges 54, 154 of the main header panel 52, which defines a groove 106 of corresponding shape. The groove 106 is adapted to receive a seal 105 which is also of similar cross-section and material to the seals 55, 155 of the header panel assembly 50. As shown therein, the seal 105 of the side seal assembly 100 is compressed by and against the side seal 55 of the adjacent header panel assembly 50 and also by the body of the electronic equipment enclosure 14 below. In combination with the vertical support bracket 102, the seal 105 of the side seal assembly 100 thus provides top-to-bottom sealing between both the leftmost enclosure 14 of FIG. 1 and the leftmost header panel assembly 50. It will be appreciated that the vertical support bracket 102 may be adjusted laterally, as described previously, to customize the spacing between the V-shaped flange 104 and the enclosure 14/header panel assembly 50. While a compressible seal is depicted in FIGS. 15 and 16, it is contemplated that a wide variety of different seals, including brush seals and deflectable blade seals, may be used in connection with the side seal assembly 100. Furthermore, while the flanges 54, 154 are shown as V-shaped, it is contemplated that the flanges 54, 154 may have any of a wide variety of different shapes and configurations, including generally perpendicular flanges and angled flanges.

When installed next to an enclosure 14 and the header panel assembly 50 above it, the side seal assembly 100 thus blocks the space between the enclosure 14 and the vertical post 16 and prevents recirculation of heated air from the rear of the enclosure 14 around the side thereof where it could mingle with the cooling air being provided to the enclosure front.

Figure 17:
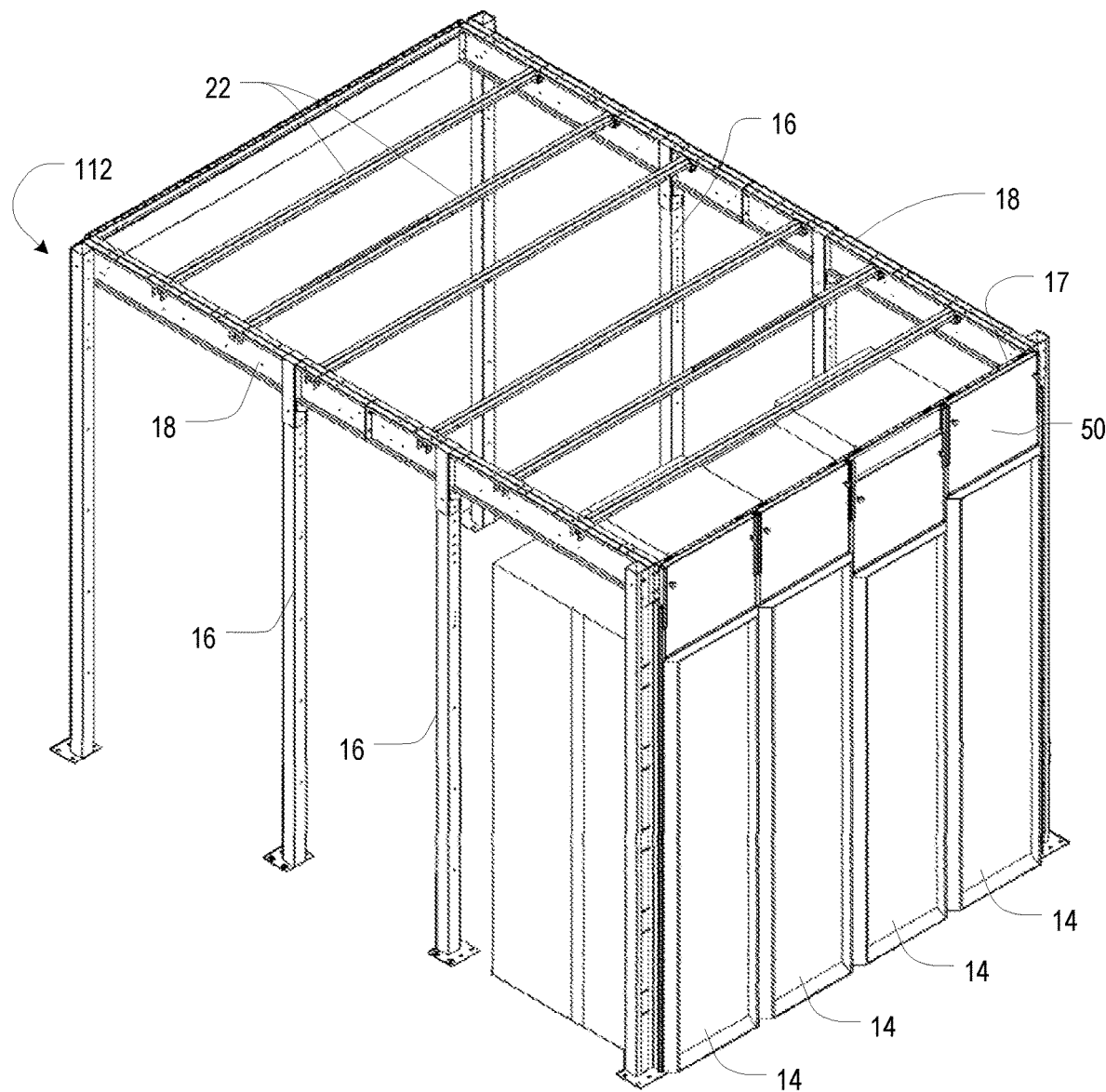
FIG. 17 is an isometric view of a hot/cold aisle containment system in use with a row of electronic equipment enclosures in accordance with another preferred embodiment of the present invention.

FIG. 17 is an isometric view of a hot/cold aisle containment system 110 in use with a row of electronic equipment enclosures 14 in accordance with another preferred embodiment of the present invention. In particular, the containment system 110 of FIG. 17 includes a larger and more comprehensive frame structure 112 adapted to receive and support various panels and other structures to more fully enclose a hot aisle behind the enclosures 14. This frame structure 112, which includes additional vertical posts 16 and horizontal beams 17, 18 as well as a plurality of horizontal joists 22. Frame structures 112 suitable for use with header panel assemblies 50 in accordance with one or more preferred embodiments of the present invention are described in commonly-assigned U.S. provisional patent application 61/411,359, entitled, "ADJUSTABLE WALL ASSEMBLY FOR HOT/COLD AISLE CONTAINMENT SYSTEM," a copy of which is attached as Appendix A, which is expressly incorporated by reference herein in its entirety.

Figure 18:
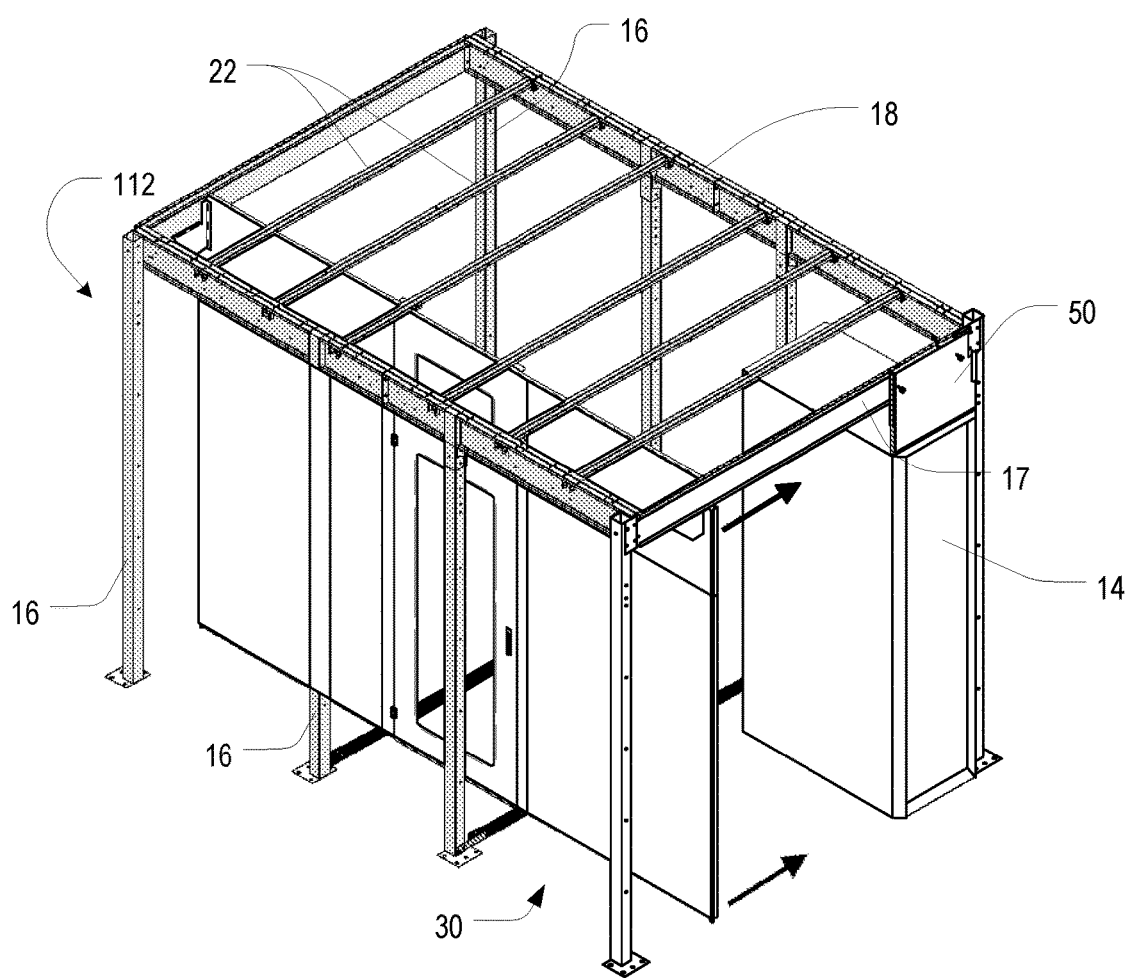
FIG. 18 is an isometric view of a hot/cold aisle containment system in use with an electronic equipment enclosure installed at one side thereof and an adjustable wall assembly temporarily positioned away from the enclosure in accordance with still another preferred embodiment of the present invention.

One example of an assembly of panels to form a wall is shown in FIG. 18, which is an isometric view of a hot/cold aisle containment system 210 in use with an electronic equipment enclosure 14 and an adjustable wall assembly 30 in accordance with still another preferred embodiment of the present invention. The enclosure 14 is installed at one end of the frame structure 112 and the adjustable wall assembly 30 is temporarily positioned away from the enclosure 14 but can be moved toward the enclosure 14 to seal off the front end of the enclosure and the space behind it. Adjustable wall assemblies suitable for use with the frame structure 112 and header panel assemblies 50 in accordance with one or more preferred embodiments of the present invention are described in the aforementioned '359 patent application, attached as Appendix A.

Figure 19:
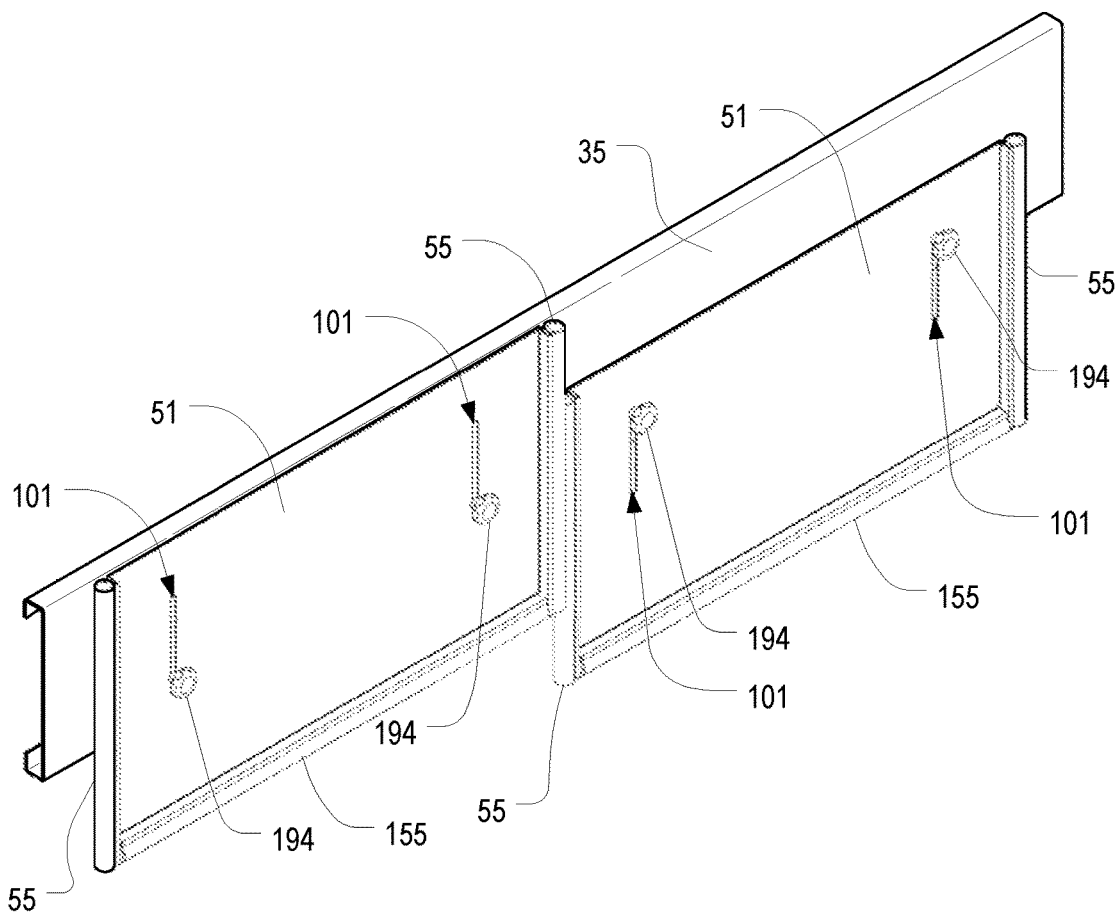
FIG. 19 is an isometric view of an overhanging beam for use in a hot/cold aisle containment system, shown with a pair of adjustable header panels attached thereto.
Figure 20:
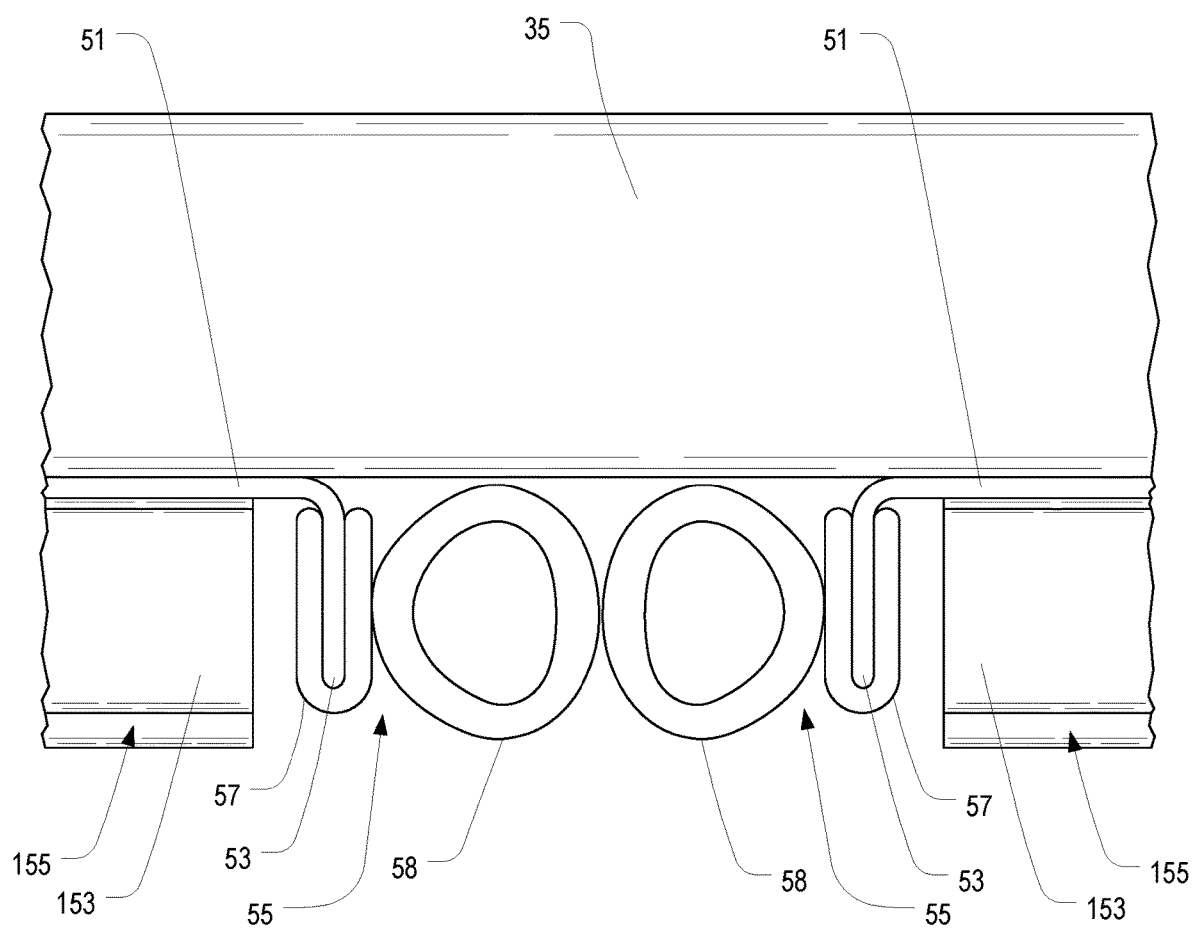
FIG. 20 is a fragmentary top view of adjacent edges of the pair of adjustable header panels of FIG. 19.

FIG. 19 is an isometric view of an overhanging beam 35 for use in a hot/cold aisle containment system, shown with a pair of adjustable header panels 51 attached thereto. FIG. 20 is a fragmentary top view of adjacent edges of the pair of adjustable header panels 51 of FIG. 19. An overhanging beam 35 may be mounted horizontally in a containment system having a row of enclosures to provide another sealing option. As shown in FIG. 19, the overhanging beam 35 accommodates one or more header panels 51, each of which includes one or more adjustment slots 101. The header panels 51 are mounted directly to the overhanging beam 35 via clamps 194, each extending through a respective adjustment slot 101 of the header panel 51 and into a respective clamp aperture (not illustrated) of the overhanging beam 35. The clamps 194 permit the header panel 51 to be adjusted vertically relative to the overhanging beam 35. By loosening the clamps 194 of a selected one of the header panels 51, the header panel 35 has infinite adjustability (within the dimensional range allowed by the adjustment slots 101). Tightening the clamps 194 fixes the header panel 35 into any desired position.

Each header panel 51 is generally flat with generally perpendicular flanges 53, 153 along the sides and bottom thereof. Each perpendicular flange 53, 153 defines an outer edge to accommodate and retain a respective seal 55, 155. Each seal 55, 155 includes a mounting portion 57 adapted to attach to the edge of the perpendicular flange 53, 153. Bosses (not illustrated) may be provided to assist in such attachment. Each seal 55, 155 further includes a body portion 58 comprised of a compressible material of any type conventionally utilized for gaskets, seals, brushes or the like. While a compressible seal is depicted in FIGS. 19 and 20, it is contemplated that a wide variety of different seals, including brush seals and deflectable blade seals, may be used in connection with the header panels 51. Furthermore, while the flanges 53, 153 are shown as generally perpendicular, it is contemplated that the flanges 53, 153 may have any of a wide variety of different shapes and configurations, including V-shaped flanges and angled flanges. The seals 55, 155 extend from the edges of the header panel 51 and are in a position to abut an adjacent structure so as to form a seal therewith. As shown in FIG. 20, the seals 55 of adjacent header panels 51 abut one another, thereby compressing the body portions 58 of each seal 55 and sealing off the boundary between adjacent header panels 51.

When installed above an enclosure 14 in a containment system and adjusted into position against the enclosure 14, the header panel 51 can effectively block the space above the enclosure 14 and prevent recirculation of heated air from the rear of the enclosure 14 over the top thereof where it could mingle with the cooling air being provided to the enclosure front. With multiple header panels 51 installed, the header panels 51 not only establish a seal with one another but may also be selectively adjusted to different heights, as depicted in FIG. 19, so as to accommodate varying heights among the enclosures installed in the containment system. The infinite adjustability (within the dimensional range) ensures that air gaps may be substantially entirely eliminated, and differences in enclosure heights managed effectively. Furthermore, by mounting the header panels 51 directly to the overhanging beam 35, the need for a separate telescoping panel to accompany the header panel 51 may be avoided.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A hot/cold aisle containment system, comprising:
   a frame structure adapted to be at least partially covered by one or more panels to define an interior space, the frame structure including a first vertical member, a second vertical member, and a horizontal member, having top and bottom sides and front and rear faces, wherein the horizontal member is supported directly by the first and second vertical members;
   at least one electronic equipment enclosure installed at least partially within the frame structure such that the first and second vertical members are on opposite sides of the at least one electronic equipment enclosure and the horizontal member of the frame structure extends from one side of the at least one electronic equipment enclosure to the other; and
   a header panel assembly installed between, and supported by, a top of the at least one electronic equipment enclosure and the horizontal member of the frame structure to prevent circulation of air above the enclosure, the header panel assembly including a main panel, wherein an upper portion of the header panel assembly extends upward alongside one of the front and rear faces of the horizontal member of the frame structure such that the upper portion of the header panel assembly overlaps and covers at least a portion of the front or rear face;
wherein the header panel assembly further includes a fixed bracket, including a main body in the form of a secondary panel, that is supported by the horizontal member of the frame structure by connecting the secondary panel thereto, wherein the main panel is adjustably coupled to the secondary panel, and wherein the secondary panel forms the upper portion of the header panel assembly that extends upward alongside one of the front and rear faces of the horizontal member of the frame structure all the way to the top side of the horizontal member such that the upper portion overlaps and covers the front or rear face.

2. The hot/cold aisle containment system of claim 1, wherein the fixed bracket, including the secondary panel of the header panel assembly, is connected to the top side of the horizontal member.

3. The hot/cold aisle containment system of claim 2, wherein a flange extends along an upper edge of the secondary panel of the header panel assembly, and wherein the secondary panel is connected to the top side of the horizontal member via the flange.

4. The hot/cold aisle containment system of claim 3, wherein a second flange extends along a side of the secondary panel of the header panel assembly, and wherein the secondary panel is connected to the bottom side of the horizontal member via the second flange.

5. A hot/cold aisle containment system, comprising:
a frame structure adapted to be at least partially covered by one or more panels to define an interior space, the frame structure including a first vertical member, a second vertical member, and a horizontal member, having top and bottom sides and front and rear faces, wherein the horizontal member is supported directly by the first and second vertical members;
at least one electronic equipment enclosure installed at least partially within the frame structure such that the first and second vertical members are on opposite sides of the at least one electronic equipment enclosure and the horizontal member of the frame structure extends from one side of the at least one electronic equipment enclosure to the other; and
a header panel assembly installed between, and supported by, a top of the at least one electronic equipment enclosure and the horizontal member of the frame structure to prevent circulation of air above the enclosure, the header panel assembly including a main panel and a secondary panel, the main panel being adjustably coupled to the secondary panel such that the main panel and the secondary panel can be vertically translated relative to one another;
wherein the secondary panel is supported by the horizontal member of the frame structure and extends upward alongside at least one of the front and rear faces of the horizontal member all the way to the top side thereof.

6. The hot/cold aisle containment system of claim 5, wherein the header panel assembly further includes a fixed bracket that is supported by the horizontal member of the frame structure, and wherein the main panel is adapted to be adjustably coupled to the fixed bracket.

7. The hot/cold aisle containment system of claim 6, wherein the header panel assembly further includes at least one clamp for retaining a portion of the main panel against a portion of the fixed bracket.

8. The hot/cold aisle containment system of claim 5, wherein the main panel is mounted to the horizontal member and adapted to be adjustable in a vertical direction relative to the horizontal member.

9. The hot/cold aisle containment system of claim 5, wherein the height of the front and rear faces of the horizontal member is greater than the width of the top and bottom sides of the horizontal member, wherein the upper portion of the header panel assembly extends upward alongside the front or rear face of the horizontal member of the frame structure all the way to the top side of the horizontal member, and wherein the upper portion of the header panel assembly is connected to the top side of the horizontal member.

10. The hot/cold aisle containment system of claim 5, wherein a flange extends along an upper edge of the header panel assembly, and wherein the upper portion of the header panel assembly is connected to the top side of the horizontal member via the flange.

11. A hot/cold aisle containment, comprising:
a frame structure adapted to be at least partially covered by one or more panels to define an interior space, the frame structure including a first vertical member, a second vertical member, and a horizontal member, wherein the horizontal member is supported directly by the first and second vertical members;
at least one electronic equipment enclosure installed at least partially within the frame structure such that the first and second vertical members are on opposite sides of the at least one electronic equipment enclosure and the horizontal member of the frame structure extends from one side of the at least one electronic equipment enclosure to the other; and
a header panel assembly installed between, and supported by, a top of the at least one electronic equipment enclosure and the horizontal member of the frame structure to prevent circulation of air above the enclosure, the header panel assembly including a main panel, wherein the header panel assembly rests on a top surface of the at least one electronic equipment enclosure, and wherein the header panel assembly further includes at least one seal along a lower edge of the main panel.

12. The hot/cold aisle containment system of claim 11, wherein the at least one seal is adapted to be held in place between a bottom of the main panel and the top surface of the at least one electronic equipment enclosure.

13. The hot/cold aisle containment system of claim 11, wherein a V-shaped flange is disposed at the lower edge of the main panel, and wherein the at least one seal is disposed at least partially in a groove defined by the V-shaped flange.

14. The hot/cold aisle containment system of claim 11, wherein a generally perpendicular flange is disposed at the lower edge of the main panel, and wherein the at least one seal is disposed along an outer edge of the generally perpendicular flange.

15. The hot/cold aisle containment system of claim 11, wherein an angled flange is disposed at the lower edge of the main panel, and wherein the at least one seal is disposed along an outer edge of the angled flange.

16. The hot/cold aisle containment system of claim 11, wherein the at least one seal is compressible.

17. The hot/cold aisle containment system of claim 11, wherein the at least one seal is a brush seal.

18. The hot/cold aisle containment system of claim 11, wherein the at least one seal is a deflectable blade seal.

\* \* \* \* \*